United States Patent
Tsuchiya et al.

(10) Patent No.: US 11,594,430 B2
(45) Date of Patent: Feb. 28, 2023

(54) SUBSTRATE LIQUID PROCESSING APPARATUS, SUBSTRATE LIQUID PROCESSING METHOD AND RECORDING MEDIUM

(71) Applicant: Tokyo Electron Limited, Tokyo (JP)

(72) Inventors: Takafumi Tsuchiya, Koshi (JP); Yuki Ishii, Koshi (JP); Hiroyuki Masutomi, Koshi (JP); Seigo Fujitsu, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/124,529

(22) Filed: Sep. 7, 2018

(65) Prior Publication Data
US 2019/0080937 A1    Mar. 14, 2019

(30) Foreign Application Priority Data

Sep. 11, 2017 (JP) .............................. JP2017-173863
Jun. 6, 2018 (JP) .............................. JP2018-108906

(51) Int. Cl.
    *H01L 21/67*      (2006.01)

(52) U.S. Cl.
    CPC .................. *H01L 21/67086* (2013.01); *H01L 21/67017* (2013.01); *H01L 21/67057* (2013.01); *H01L 21/67173* (2013.01); *H01L 21/67253* (2013.01); *H01L 21/67207* (2013.01)

(58) Field of Classification Search
    USPC ....................................... 156/345.11, 345.18
    See application file for complete search history.

(56) References Cited

U.S. PATENT DOCUMENTS

| | | | | |
|---|---|---|---|---|
| 6,228,211 B1* | 5/2001 | Jeong | ...................... | C03C 15/02 |
| | | | | 156/345.11 |
| 2001/0009156 A1* | 7/2001 | Shindo | .................... | B08B 3/044 |
| | | | | 134/57 R |
| 2002/0079055 A1* | 6/2002 | Kim | ........................ | C03C 15/00 |
| | | | | 156/345.11 |
| 2007/0166655 A1* | 7/2007 | Ooshima | ........... | H01L 21/67017 |
| | | | | 432/120 |

(Continued)

FOREIGN PATENT DOCUMENTS

| JP | S63-077525 A | 4/1988 |
|---|---|---|
| JP | H04-369361 A | 12/1992 |
| JP | H07-058078 A | 3/1995 |

(Continued)

*Primary Examiner* — Ram N Kackar
(74) *Attorney, Agent, or Firm* — Pearne & Gordon LLP

(57) ABSTRACT

A substrate liquid processing apparatus A1 includes a processing tub 41 accommodating a processing liquid 43 and a substrate 8; a gas nozzle 70 discharging a gas into a lower portion within the processing tub 41; a gas supply unit 90 supplying the gas; a gas supply line 93 connecting the gas nozzle 70 with the gas supply unit 90; a decompression unit 95 introducing the processing liquid 43 within the processing tub 41 into the gas supply line 93 by decompressing the gas supply line 93; and a control unit 7 performing a first control of controlling the gas supply unit 90 to stop supply of the gas and controlling the decompression unit 95 to introduce the processing liquid 43 into the gas supply line 93 in a part of an idle period during which the substrate 8 is not accommodated in the processing tub 41.

17 Claims, 22 Drawing Sheets

(56) References Cited

U.S. PATENT DOCUMENTS

2015/0302276 A1* 10/2015 Guan ................ G06K 9/00335
382/159
2017/0287744 A1* 10/2017 Kobayashi .......... H01L 21/6704

FOREIGN PATENT DOCUMENTS

| JP | 110145107 | * | 5/1999 | ........... H01L 21/306 |
| JP | H11-204476 A | | 7/1999 | |
| JP | 2015-182036 A | | 10/2015 | |

* cited by examiner

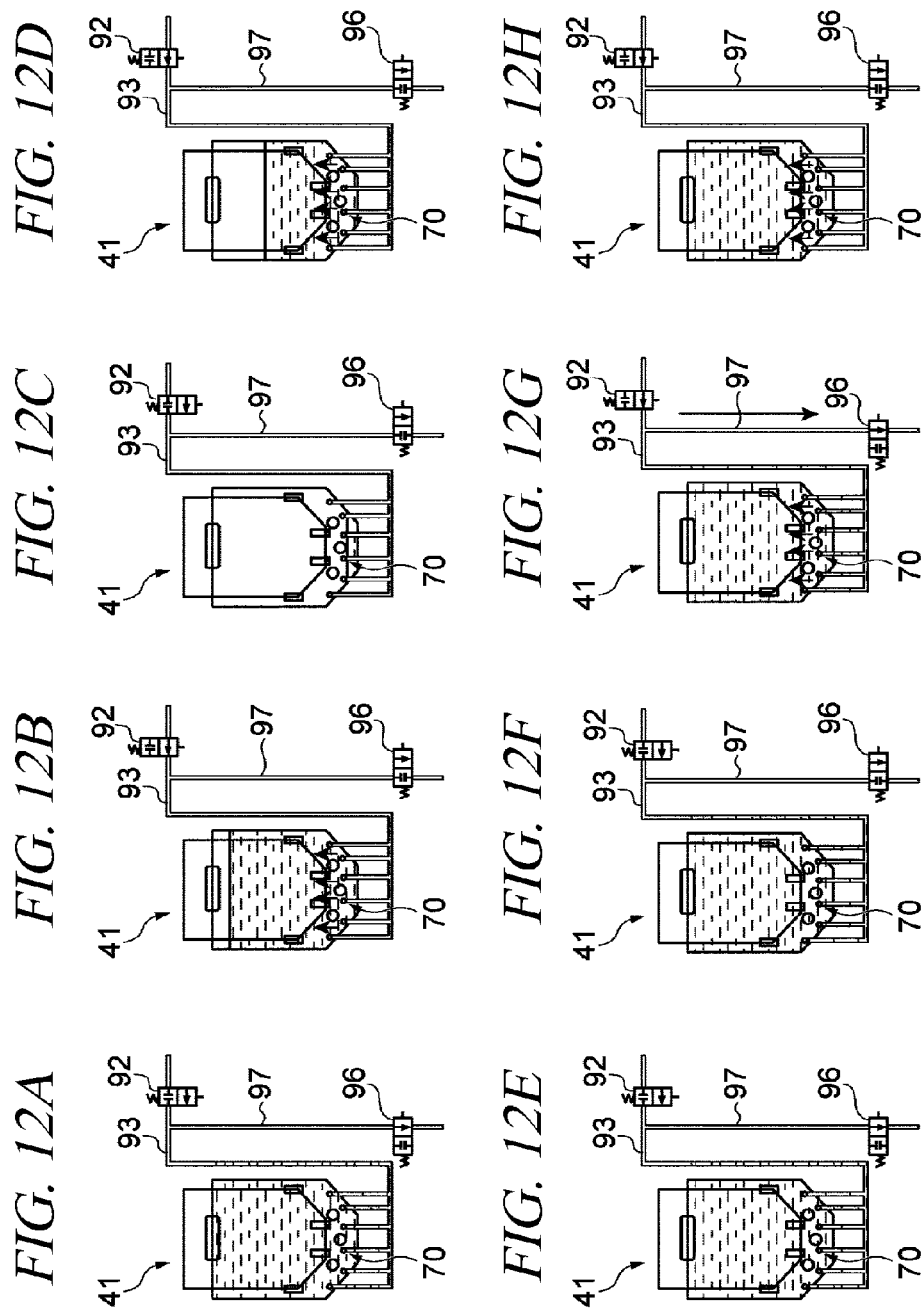

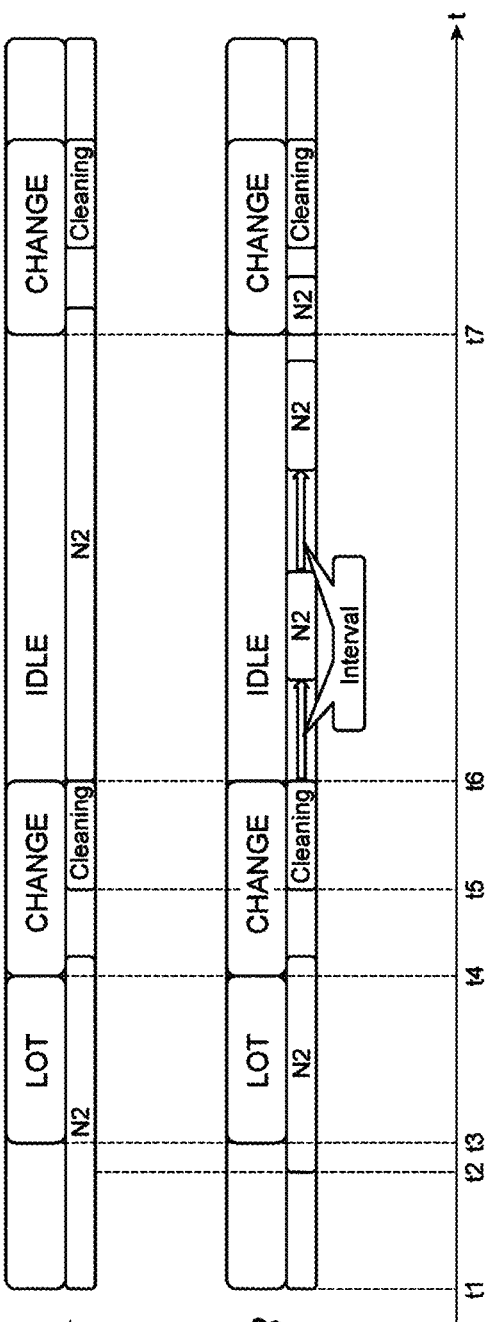

FIG. 19
| IMAGE OF INSIDE OF PROCESSING TUB | BOILING STATE | IMAGE INTERPRETATION (NUMBER OF BUBBLES/ml) |
|---|---|---|
|  | NON-BOILING | 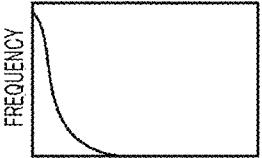 |
| 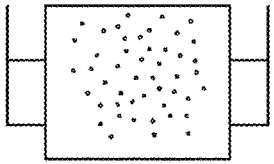 | WEAK BOILING |  |
| 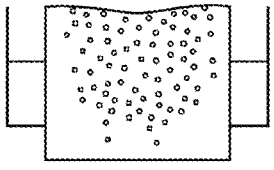 | APPROPRIATE BOILING |  |
| 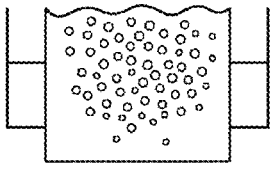 | STRONG BOILING | 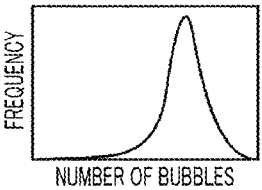 |
| 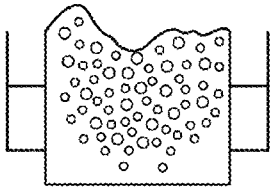 | OVERBOILING | 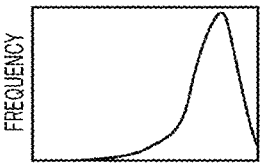 |

SUBSTRATE LIQUID PROCESSING APPARATUS, SUBSTRATE LIQUID PROCESSING METHOD AND RECORDING MEDIUM

CROSS-REFERENCE TO RELATED APPLICATION

This application claims the benefit of Japanese Patent Application Nos. 2017-173863 and 2018-108906 filed on Sep. 11, 2017 and Jun. 6, 2018, respectively, the entire disclosures of which are incorporated herein by reference.

TECHNICAL FIELD

The various aspects and embodiments described herein pertain generally to a substrate liquid processing apparatus, a substrate liquid processing method and a recording medium.

BACKGROUND

Patent Document 1 discloses a processing apparatus equipped with an overflow tub; a pump configured to circulate an etching liquid (processing liquid) within the tub; a heater configured to heat the processing liquid within the tub to a preset temperature; a temperature controller configured to control the preset temperature; a frame configured to fix a wafer cassette to a scattering plate provided at a bottom portion within the tub; and a bubbler configured to perform bubbling of the processing liquid within the tub with nitrogen.

Patent Document 1: Japanese Patent Laid-open Publication No. H07-058078

SUMMARY

A gas such as the nitrogen used in the aforementioned bubbling is supplied from a gas nozzle provided at a lower portion of the tub. Here, as the gas is supplied from the gas nozzle, an upward flow of the processing liquid is generated within the tub. Accordingly, though it becomes easier to maintain a state of the processing liquid uniform, stay of the processing liquid at a certain place, which is caused by the flow of the gas, may also easily occur. To be specific, at an edge of an opening of the gas nozzle, the stay of the processing liquid, which is caused by a turbulence of the gas flow, may easily occur. For this reason, crystals of components eluted from the substrate and various kinds of pipelines may be generated at the edge of the opening of the gas nozzle, and these crystals may become a hindrance to a gas discharge.

In view of the foregoing, exemplary embodiments provide a substrate liquid processing apparatus, a substrate liquid processing method and a recording medium effective to suppress generation of a crystal or to remove the crystal.

In one exemplary embodiment, a substrate liquid processing apparatus includes a processing tub configured to accommodate a processing liquid and a substrate therein; a gas nozzle configured to discharge a gas into a lower portion within the processing tub; a gas supply unit configured to supply the gas; a gas supply line through which the gas nozzle and the gas supply unit are connected; a decompression unit configured to introduce the processing liquid within the processing tub into the gas supply line by decompressing the gas supply line; and a control unit configured to perform a first control of controlling the gas supply unit to stop a supply of the gas and controlling the decompression unit to introduce the processing liquid into the gas supply line in a part of an idle period during which the substrate is not accommodated in the processing tub.

According to the exemplary embodiment, it is possible to provide a substrate liquid processing apparatus, a substrate liquid processing method and a recording medium effective to suppress the generation of the crystal or remove the crystal.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 12A to FIG. 12H are diagrams for describing the liquid changing processing sequence;

FIG. 14A and FIG. 14B are diagrams for describing the substrate processing sequences: FIG. 14A is a diagram for describing a substrate processing sequence according to a comparative example and FIG. 14B is a diagram for describing the substrate processing sequence according to the exemplary embodiment;

FIG. 19 is a diagram showing a relationship between the number of bubbles and a boiling state;

FIG. 22A illustrates a state before crystallization, FIG. 22B illustrates a state during the crystallization and FIG. 22C illustrates a state where the gas nozzle is clogged after the crystallization.

DETAILED DESCRIPTION

Figure 1:
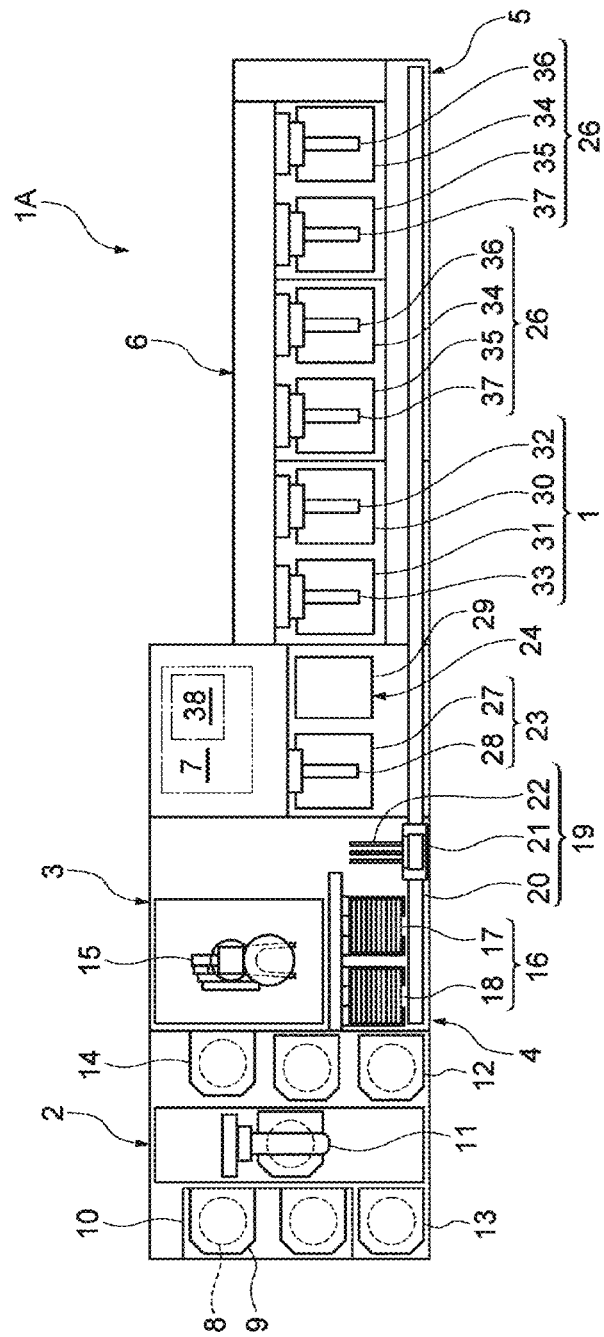
FIG. 1 is a plan view schematically illustrating a substrate liquid processing system.

In the following detailed e, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the description, same parts or parts having same function will be assigned same reference numerals, and redundant description will be omitted.

As illustrated in FIG. 1, the substrate liquid processing system 1A includes a carrier carry-in/out unit 2; a lot forming unit 3, a lot placing unit 4, a lot transferring unit 5, a lot processing unit 6 and a control unit 7.

The carrier carry-in/out unit 2 is configured to perform a carry-in and a carry-out of a carrier 9 in which a plurality (e.g., 25 sheets) of substrates (silicon wafers) 8 are vertically arranged in a horizontal posture. The carrier carry-in/out unit 2 is equipped with a carrier stage 10 configured to place multiple carriers 9 thereon; a carrier transfer device 11 configured to transfer the carrier 9; carrier stocks 12 and 13 configured to place therein the carrier 9 temporarily; and a carrier placing table 14 configured to place the carrier 9 thereon. Here, the carrier stock 12 temporarily places therein a substrate 8 to become a product before being processed by the lot processing unit 6. Further, the carrier stock 13 temporarily places therein the substrate 8 to become a product after being processed by the lot processing unit 6.

The carrier carry-in/out unit 2 transfers the carrier 9, which is carried onto the carrier stage 10 from the outside, to the carrier stock 12 or the carrier placing table 14 by using the carrier transfer device 11. Further, the carrier carry-in/out unit 2 transfers the carrier 9, which is placed on the carrier placing table 14, to the carrier stock 13 or the carrier stage 10 by using the carrier transfer device 11. The carrier 9 transferred to the carrier stage 10 is carried to the outside.

The lot forming unit 3 forms a lot composed of a multiple number (e.g., 50 sheets) of substrates 8 to be processed at the same time which are combined with substrates 8 accommodated in one or multiple carriers 9. Further, when forming the lot, the substrates 8 may be arranged such that surfaces thereof having patterns formed thereon face each other or such that the surfaces thereof having the patterns formed thereon all face to one direction. The lot forming unit 3 is equipped with a substrate transfer device 15 configured to transfer a plurality of substrates 8. Further, the substrate transfer device 15 is capable of changing a posture of the substrates 8 from a horizontal posture to a vertical posture and from the vertical posture to the horizontal posture while transferring the substrates 8.

In the lot forming unit 3, the substrates 8 are transferred into the lot placing unit 4 from the carrier 9 placed on the carrier placing table 14 by using the substrate transfer device 15, and the substrates 8 forming the lot are placed in the lot placing unit 4. Further, in the lot forming unit 3, the lot placed in the lot placing unit 4 is transferred into the carrier 9 placed on the carrier placing table 14 by the substrate transfer device 15. Further, the substrate transfer device 15 is equipped with, as a substrate supporting unit configured to support the multiple number of substrates 8, two types of substrate supporting unit, that is, a before-processed substrate supporting unit configured to support the substrates 8 before being subjected to a processing (that is, before being transferred by the lot transferring unit 5); and an after-processed substrate supporting unit configured to support the processed substrates 8 (after being transferred by the lot transferring unit 5). Accordingly, particles or the like adhering to the substrates 8 before being processed may be suppressed from adhering to the substrates 8 after being processed.

In the lot placing unit 4, the lot transferred between the lot forming unit 3 and the lot processing unit 6 by the lot transferring unit 5 is temporarily placed (stands by) on the lot placing table 16. The lot placing unit 4 is equipped with a carry-in side lot placing table 17 configured to place thereon the lot before being processed (before being transferred by the lot transferring unit 5); and a carry-out side lot placing table 18 configured to place thereon the lot after being processed (after being transferred by the lot transferring unit 5). On each of the carry-in side lot placing table 17 and the carry-out side lot placing table 18, the multiple number of substrates 8 corresponding to the single lot are arranged in a forward-backward direction with the vertical posture. In the lot placing unit 4, the lot formed in the lot forming unit 3 is placed on the carry-in side lot placing table 17, and this lot is carried into the lot processing unit 6 through the lot transferring unit 5. Further, in the lot placing unit 4, the lot carried out of the lot processing unit 6 through the lot transferring unit 5 is placed on the carry-out side lot placing table 18, and this lot is transferred into the lot forming unit 3.

The lot transferring unit 5 is configured to transfer the lot between the lot placing unit 4 and the lot processing unit 6 and within the lot processing unit 6. The lot transferring unit 5 is equipped with the lot transfer device 19 configured to transfer the lot. The lot transfer device 19 includes a rail 20 extended along the lot placing unit 4 and the lot processing unit 6; and a moving body 21 configured to be moved along the rail 20 while holding the multiple number of substrates 8. The moving body 21 is provided with a substrate holding body 22 for holding the multiple number of substrates 8 arranged in the forward-backward direction with the vertical posture, and the substrate holding body 22 is configured to be movable forward and backward. The lot transferring unit 5 receives the lot placed on the carry-in side lot placing table 17 with the substrate holding body 22 of the lot transfer device 19 and delivers the received lot to the lot processing unit 6. Further, the lot transferring unit 5 receives the lot processed by the lot processing unit 6 with the substrate holding body 22 of the lot transfer device 19 and delivers the received lot to the carry-out side lot placing table 18.

Further, the lot transferring unit 5 also performs the transfer of the lot within the lot processing unit 6 by using the lot transfer device 19.

The lot processing unit 6 is configured to perform a processing such as etching, cleaning and drying on the single lot composed of the substrates 8 arranged in the forward-backward direction with the vertical posture. The lot processing unit 6 includes a drying apparatus 23 configured to perform a drying processing on the substrates 8; a substrate holding body cleaning apparatus 24 configured to perform a cleaning processing on the substrate holding body 22; a cleaning apparatus 1 configured to perform a cleaning processing on the substrates 8; and two etching apparatuses 26 according to the exemplary embodiment, each of which is configured to perform an etching processing on the substrates 8.

The drying apparatus 23 is equipped with a processing tub 27; and a substrate elevating device 28 provided at the processing tub 27 and configured to be moved up and down. A processing gas for drying (IPA (isopropyl alcohol) or the like) is supplied into the processing tub 27. The substrate elevating device 28 holds the substrates 8 corresponding to the single lot while keeping the substrates 8 arranged in the forward-backward direction with the vertical posture. The drying apparatus 23 receives the lot from the substrate holding body 22 of the lot transfer device 19 with the substrate elevating device 28, and moves the received lot up and down with the substrate elevating device 28, so that a drying processing of the substrates 8 is performed with the processing gas for drying supplied into the processing tub 27. Further, the drying apparatus 23 delivers the lot to the substrate holding body 22 of the lot transfer device 19 from the substrate elevating device 28. The substrate holding body cleaning apparatus 24 includes a processing tub 29 and is configured to supply a processing liquid for cleaning and a drying gas into this processing tub 29. By supplying the drying gas after supplying the processing liquid for cleaning to the substrate holding body 22 of the lot transfer device 19, a cleaning processing on the substrate holding body 22 is performed.

The cleaning apparatus 1 has a processing tub 30 for cleaning and a processing tub 31 for rinsing. The processing tub 30 for cleaning is equipped with a substrate elevating device 32 configured to be vertically movable, and the processing tub 31 for rinsing is equipped with a substrate elevating device 33 configured to be vertically movable. The processing tub 30 for cleaning stores therein a processing liquid for cleaning (SC-1 or the like). The processing tub 31 for rinsing stores therein a processing liquid for rinsing (pure water or the like). The etching apparatus 26 has a processing tub 34 for etching and a processing tub 35 for rinsing. The processing tub 34 and the processing tub 35 are equipped with a substrate elevating device 36 and a substrate elevating device 37 configured to be vertically movable, respectively. The processing tub 34 for etching stores therein a processing liquid for etching (a phosphoric acid aqueous solution). The processing tub 35 for rinsing stores therein a processing liquid for rinsing (pure water or the like).

The cleaning apparatus 1 and the etching apparatus 26 have the same configuration. The cleaning apparatus 1 will be discussed. The multiple number of substrates 8 belonging to the single lot are held by the substrate elevating device 32 while being arranged in the forward-backward direction with the vertical posture. In the cleaning apparatus 1, the substrate elevating device 32 receives the lot from the substrate holding body 22 of the lot transfer device 19, and the received lot is moved up and down by the substrate elevating device 32. Accordingly, the lot is immersed in the processing liquid for cleaning in the processing tub 30, so that a cleaning processing is performed on the substrates 8. Thereafter, the cleaning apparatus 1 delivers the lot to the substrate holding body 22 of the lot transfer device 19 from the substrate elevating device 32. Then, the lot is received by the substrate elevating device 33 from the substrate holding body 22 of the lot transfer device 19, and the received lot is moved up and down by the substrate elevating device 33. Accordingly, the lot is immersed in the processing liquid for rinsing in the processing tub 31, so that a rinsing processing is performed on the substrates 8. Thereafter, the lot is delivered to the substrate holding body 22 of the lot transfer device 19 from the substrate elevating device 33.

The control unit 7 controls operations of individual components (the carrier carry-in/out unit 2, the lot forming unit 3, the lot placing unit 4, the lot transferring unit 5, the lot processing unit 6, cleaning apparatus 1) of the substrate liquid processing system 1A. The control unit 7 may be implemented by, for example, a computer and has a computer-readable recording medium 38. The recording medium 38 stores therein programs for controlling various types of processings performed in the cleaning apparatus 1. The control unit 7 controls the operation of the cleaning apparatus 1 by reading and executing the programs stored in the recording medium 38. Further, the programs are stored in the compute-readable recording medium 38 and may be installed to the recording medium 38 of the control unit 7 from another recording medium. The computer-readable recording medium 38 may be implemented by, by way of example, a hard disk HD, a flexible disk FD, a compact disk CD, a magnet optical disk MO, a memory card, or the like.

[Substrate Liquid Processing Apparatus]

Figure 2:
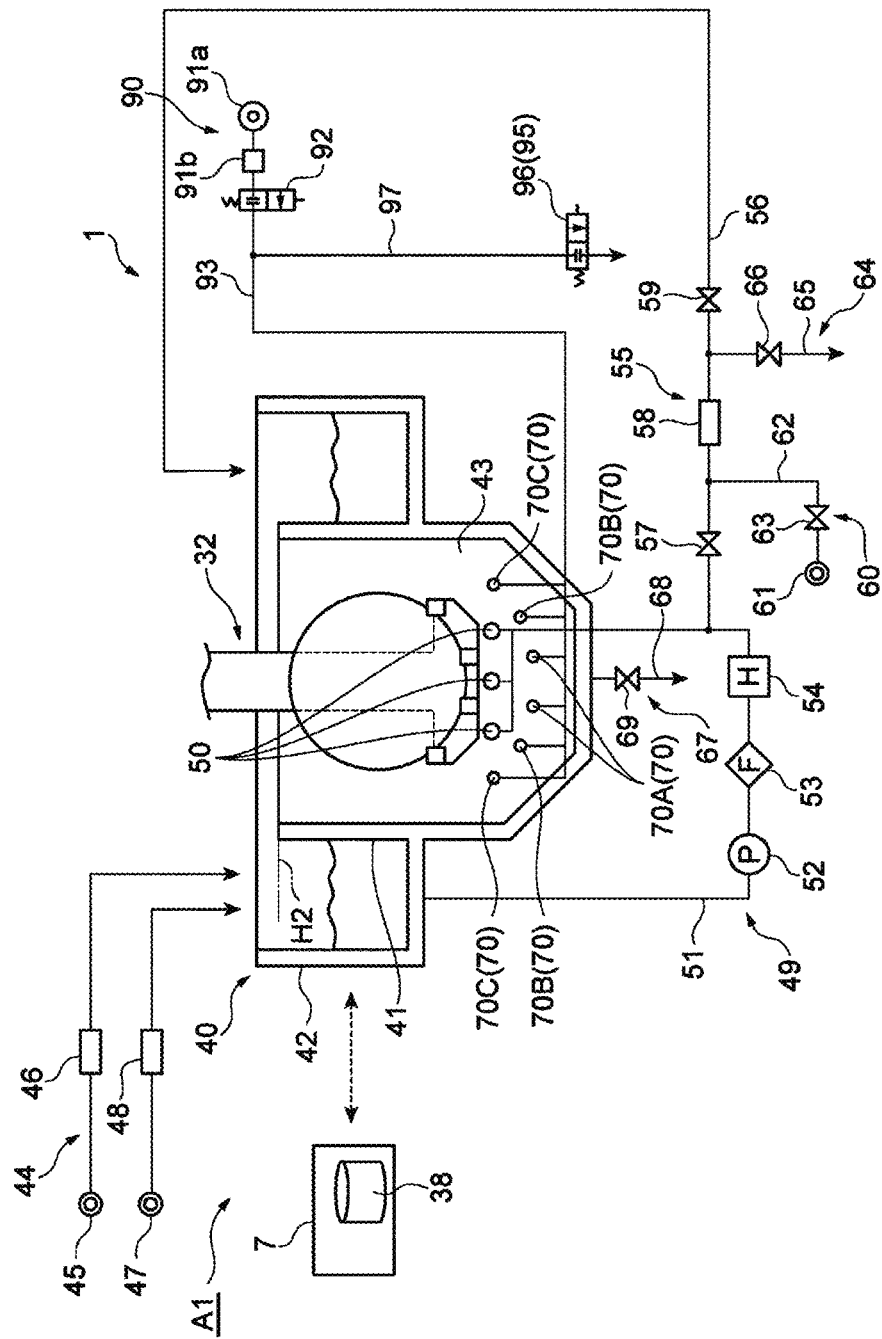
FIG. 2 is a schematic diagram of an etching apparatus.
Figure 3:
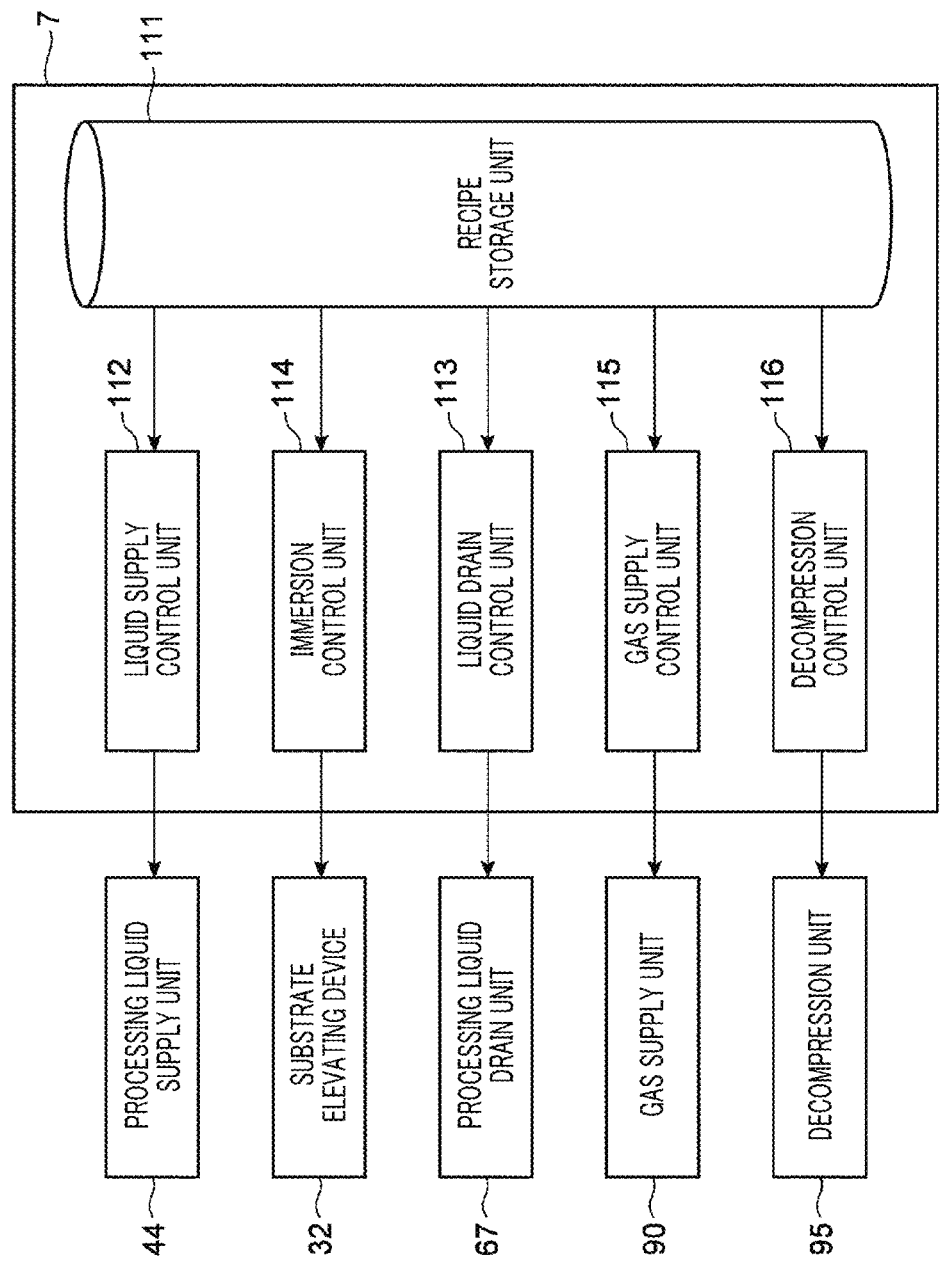
FIG. 3 is a block diagram illustrating a functional configuration of a control unit.

Now, a substrate liquid processing apparatus A1 belonging to the substrate liquid processing system 1A will be described in detail. As illustrated in FIG. 2 and FIG. 3, the substrate liquid processing apparatus A1 includes the cleaning apparatus 1 and the control unit 7.

(Cleaning Apparatus)

The cleaning apparatus 1 is equipped with a liquid processing unit 40, a processing liquid supply unit 44, a processing liquid drain unit 67, a multiple number of (e.g., six) gas nozzles 70, a gas supply unit 90, a gas supply line 93, a decompression unit 95 and an opening line 97.

The liquid processing unit 40 is configured to perform a liquid processing (cleaning processing) on the substrate 8, and includes a processing tub 41, an outer tub 42 and a processing liquid 43. The processing tub 41 accommodates therein the processing liquid 43 and the substrate 8. A specific example of the processing liquid 43 may be SC-1. Since the top of the processing tub 41 is opened, the substrate 8 can be immersed in the processing liquid 43 within the processing tub 41 from above. The substrate 8 having a circular shape is placed within the processing tub 41 with an uprightly standing posture. Hereinafter, a direction along the substrate 8 within the processing tub 41 to be orthogonal to a height direction may sometimes be referred to as "width direction," and a direction orthogonal to the height direction and the width direction (that is, a thickness direction of the substrate 8 within the processing tub 41) may sometimes be referred to as "inward direction". Both side portions of a bottom surface of the processing tub 41 in the width direction are heightened outwards. The outer tub 42 is configured to surround the processing tub 41 and accommodates the processing liquid 43 overflown from the processing tub 41.

The processing liquid supply unit 44 supplies the processing liquid 43 into the processing tub 41. By way of example, the processing liquid supply unit 44 includes a processing liquid source 45, a flow rate controller 46, a pure water source 47, a flow rate controller 48, a processing liquid circulation unit 49 and a concentration measurement unit 55.

The processing liquid source 45 is configured to supply the processing liquid 43 into the outer tub 42. The flow rate controller 46 is provided at a path of the processing liquid 43 from the processing liquid source 45 to the outer tub 42, and is configured to adjust an opening/closing operation and an opening degree of the corresponding path. The pure water source 47 supplies pure water into the outer tub 42. The pure water replenishes moisture evaporated as the processing liquid 43 is heated. The flow rate controller 48 is provided at a path of the pure water from the pure water source 47 to the outer tub 42, and is configured to adjust an opening/closing operation and an opening degree of the corresponding path.

The processing liquid circulation unit 49 is configured to send the processing liquid 43 within the outer tub 42 into a lower portion within the processing tub 41. By way of example, the processing liquid circulation unit 49 includes a plurality of (e.g., three) processing liquid nozzles 50, a circulation path 51, a supply pump 52, a filter 53 and a heater 54.

The processing liquid nozzles 50 are provided at a lower portion within the processing tub 41 and configured to discharge the processing liquid 43 into the processing tub 41. These processing liquid nozzles 50 are arranged in the width direction at the same height and respectively extended in the inward direction. The processing liquid 43 is guided into the plurality of processing liquid nozzles 50 from the outer tub 42 through the circulation path 51. One end of the circulation path 51 is connected to a bottom portion of the outer tub 42. The other end of the circulation path 51 is branched into a plurality of branch paths which are respectively connected to the plurality of processing liquid nozzles 50. The supply pump 52, the filter 53 and the heater 54 are provided at the circulation path 51 and arranged in sequence from an upstream side (outer tub 42 side) to a downstream side (processing liquid nozzles 50 side). The supply pump 52 is configured to force-feed the processing liquid 43 from the upstream side to the downstream side. The filter 53 is configured to remove particles mixed in the processing liquid 43. The heater 54 is configured to heat the processing liquid 43 to a set temperature. By way of non-limiting example, the set temperature is set to be of a value near a boiling point of the processing liquid 43.

The concentration measurement unit 55 is configured to measure a concentration of the processing liquid 43. By way of example, the concentration measurement unit 55 includes a measurement path 56, opening/closing valves 57 and 59, a concentration sensor 58, a cleaning fluid supply unit 60 and a cleaning fluid drain unit 64.

The measurement path 56 is branched from the circulation path 51 between the heater 54 and the processing liquid nozzles 50 and is configured to allow a part of the processing liquid 43 to be flown back into the outer tub 42. The opening/closing valves 57 and 59 are arranged at the measurement path 56 in sequence from an upstream side (circulation path 51 side) to a downstream side (outer tub 42 side) and are respectively configured to open or close the measurement path 56. The concentration sensor 58 is provided at the measurement path 56 between the opening/closing valves 57 and 59, and is configured to measure a concentration of the processing liquid 43 (for example, a concentration of phosphoric acid) flowing in the measurement path 56. The cleaning fluid supply unit 60 is configured to supply a fluid for cleaning (for example, pure water) to the concentration sensor 58. By way of example, the cleaning fluid supply unit 60 is equipped with a cleaning fluid source 61, a supply path 62 and an opening/closing valve 63. The cleaning fluid source 61 is a source of the fluid for cleaning. Through the supply path 62, the fluid for cleaning is supplied from the cleaning fluid source 61 to the concentration sensor 58. One end of the supply path 62 is connected to the cleaning fluid source 61, and the other end of the supply path 62 is connected between the opening/closing valve 57 and the concentration sensor 58. The opening/closing valve 63 opens or closes the supply path 62. The cleaning fluid drain unit 64 is configured to drain the fluid for cleaning. For example, the cleaning fluid drain unit 64 is equipped with a drain path 65 and an opening/closing valve 66. Through the drain path 65, the fluid for the cleaning having passed through the concentration sensor 58 is drained. One end of the drain path 65 is connected between the concentration sensor 58 and the opening/closing valve 59, and the other end of the drain path 65 is connected to a liquid drain line (not shown) of the substrate liquid processing system 1A. The opening/closing valve 66 opens or closes the drain path 65.

The processing liquid drain unit 67 is configured to drain the processing liquid 43 from the inside of the processing tub 41. For example, the processing liquid drain unit 67 is equipped with a liquid drain path 68 and an opening/closing valve 69. The processing liquid 43 within the processing tub 41 is drained through the liquid drain path 68. One end of the liquid drain path 68 is connected to a bottom portion of the processing tub 41, and the other end of the liquid drain path 68 is connected to the liquid drain line (not shown) of the substrate liquid processing system 1A. The opening/closing valve 69 opens or closes the liquid drain path 68.

The multiple number of gas nozzles 70 are configured to discharge an inert gas (e.g., a $N_2$ gas) at the lower portion within the processing tub 41. These gas nozzles 70 are arranged in the width direction under the processing liquid nozzles 50, and are respectively extended in the inward direction. Heights of the gas nozzles 70 are increased as placement positions of the gas nozzles 70 are distanced away from a center in the width direction. The multiple number of gas nozzles 70 may be arranged along an arc concentric with the substrate 8. Here, the configuration of being arranged along the arc includes not only a case where the individual gas nozzles 70 are located on the arc but also a case where a part of the gas nozzles 70 is deviated from the arc within a preset range. The preset range may be set as required as long as uniformity in a distance from each gas nozzle 70 to a center of the substrate 8 is increased, as compared to a configuration where the multiple number of gas nozzles 70 are located at the same height.

By way of example, the multiple number of gas nozzles 70 include a pair of gas nozzles 70A located at an innermost side in the width direction; a pair of gas nozzles 70B located at an outer side than the pair of gas nozzles 70A; and a pair of gas nozzles 70C located at an outer side than the pair of gas nozzles 70B. The gas nozzles 70B are located higher than the gas nozzles 70A, and the gas nozzles 70C are located higher than the gas nozzles 70B. The gas nozzles 70A, 70B and 70C are arranged along the arc which is concentric with the substrate 8. Further, the number of the gas nozzles 70 and the arrangement thereof may be appropriately modified. For example, the multiple number of gas nozzles 70 may be placed at the same height.

The gas supply unit 90 is configured to supply an inert gas. The gas supply unit 90 includes a gas source 91a, a flow rate controller 91b and a supply valve 92. The gas source 91a is a source of the inert gas. The supply valve 92 is provided at the gas supply line 93 and configured to open or close the gas supply line 93. The flow rate controller 91b is configured to adjust a flow rate of the inert gas by adjusting an opening degree of the gas supply line 93 between the supply valve 92 and the gas source 91a. The gas supply line 93 is a supply line for the inert gas, which connects the plurality of gas nozzles 70 and the gas supply unit 90 (specifically, the gas source 91a).

One end of the opening line 97 is connected to the gas supply line 93, and the other end thereof is opened to the atmosphere. The inert gas flowing in the gas supply line 93 is opened to the atmosphere through the opening line 97. The decompression unit 95 is configured to decompress the gas supply line 93 to thereby introduce the processing liquid 43 within the processing tub 41 into the gas supply line 93. The decompression unit 95 is equipped with an opening valve 96 (valve) provided at the opening line 97 to open or close the opening line 97. As the opening valve 96 is opened, the decompression unit 95 decompresses the gas supply line 93 and introduces the processing liquid 43 within the processing tub 41 into the gas supply line 93 from the multiple number of gas nozzles 70. Further, a level of the pressure may not be limited to the atmospheric pressure as long as the processing liquid 43 within the processing tub 41 can be introduced. Further, a mechanism of the decompression unit 95 is not particularly limited, either.

(Control Unit)

The control unit 7 performs, in a part of an idle period in which the substrate 8 is not accommodated in the processing tub 41, a first control of: controlling the gas supply unit 90 such that the supply of the gas is stopped; and controlling the decompression unit 95 such that the processing liquid 43 is introduced into the gas supply line 93.

In the idle period, the control unit 7 may alternately repeat the aforementioned first control and a second control of controlling the gas supply unit 90 to perform the supply of the gas.

The control unit 7 may perform, as the second control in a state that the processing liquid 43 is introduced in the gas supply line 93, a third control of controlling the gas supply unit 90 to perform the supply of the gas and controlling the decompression unit 95 such that the opening valve 96 is opened and the gas flowing in the gas supply line 93 is introduced into the opening line 97; and a fourth control of controlling the gas supply unit 90 to perform the supply of the gas and controlling the decompression unit 95 such that the opening valve 96 is closed and the gas flowing in the gas supply line 93 flows toward the gas nozzles 70.

The control unit 7 may perform, as the fourth control, a fifth control of controlling the gas supply unit 90 such that the processing liquid 43 introduced in the gas supply line 93 flows to the processing tub 41 and a sixth control of controlling the gas supply unit 90 such that the processing liquid 43 introduced in the gas supply line 93 is slightly moved within the gas supply line.

The idle period includes a first idle period transited from a substrate processing period during which the processing upon the substrate 8 is performed in the processing tub 41; and a second idle period transited from a processing liquid changing period during which the processing liquid 43 is changed in the processing tub 41. The control unit 7 may control the decompression unit 95 such that an introduction amount of the processing liquid 43 in a second idle period, which refers to the first control in the second idle control, is larger than an introduction amount of the processing liquid 43 in a first idle control, which refers to the first control in the first idle period.

Further, in the following description, periods during a substrate liquid processing based on the control of the control unit 7 may sometimes be referred to as "lot period," "processing liquid changing period" and "idle period". The lot period (substrate processing period) is a period during which a lot processing (substrate processing) is performed. The lot processing refers to a processing in which the multiple number of substrates 8 belonging to the single lot are immersed in the processing liquid 43. The processing liquid changing period is a period during which a liquid changing processing is performed. The liquid changing processing is a processing in which the processing liquid within the processing tub 41 is changed. The idle period is a period during which the substrate 8 is not accommodated in the processing liquid 43 and the aforementioned liquid changing processing is not performed. The idle processing refers to a processing performed in the idle period.

FIG. 3 is a block diagram illustrating a functional configuration of the control unit 7. As depicted in FIG. 3, the control unit 7 includes, as functional components (hereinafter, referred to as "functional modules"), a recipe storage unit 111, a liquid supply control unit 112, a liquid drain control unit 113, an immersion control unit 114, a gas supply control unit 115 and a decompression control unit 116.

The recipe storage unit 111 is configured to store therein a recipe as various kinds of parameters previously set to specify contents of processings. A sequence of the processings, a required time (processing time) for each processing, and so forth are set in the recipe. The liquid supply control unit 112, the liquid drain control unit 113, the immersion control unit 114, the gas supply control unit 115 and the decompression control unit 116 perform various kinds of controls according to the recipe.

The liquid supply control unit 112 is configured to control the processing liquid supply unit 44 to supply the processing liquid 43 into the processing tub 41 according to the recipe stored in the recipe storage unit 111. To elaborate, the liquid supply control unit 112 opens the flow rate controller 46 to allow the processing liquid 43 to be supplied into the outer tub 42 and, at the same time, drives the supply pump 52 to allow the processing liquid 43 to be sent into the processing tub 41 from the outer tub 42.

The liquid drain control unit 113 is configured to control the processing liquid drain unit 67 to drain the processing liquid 43 from the processing tub 41 according to the recipe stored in the recipe storage unit 111. To elaborate, the liquid drain control unit 113 closes the flow rate controller 46 and the flow rate controller 48 such that the supply of the processing liquid 43 and the supply of the pure water are stopped, and turns the opening/closing valve 69 into an open state from a closed state to allow draining of the processing liquid 43 from the processing tub 41 to be started.

The immersion control unit 114 controls, according to the recipe stored in the recipe storage unit 11, the substrate elevating device 32 such that the substrates 8 (the multiple number of substrates 8 belonging to the single lot) are immersed in the processing liquid 43. To elaborate, the immersion control unit 114 lowers supporting arms (not shown) of the substrate elevating device 32 to a height where the substrates 8 belonging to the single lot are immersed in the processing liquid 43. Then, the immersion control unit 114 stands by for a predetermined substrate processing time stored in the recipe storage unit 111, and, then, raises the supporting arms (not shown) of the substrate elevating device 32 up to a height where the substrates 8 belonging to the single lot are located higher than a liquid surface of the processing liquid 43.

The gas supply control unit 115 is configured to control the gas supply unit 90 to supply the inert gas according to the recipe stored in the recipe storage unit 111. To elaborate, the gas supply control unit 115 opens the supply valve 92 such that the gas is supplied into the gas supply line 93. Further, the gas supply control unit 115 adjusts an opening degree of the flow rate controller 91b such that a flow rate of the gas being supplied is adjusted.

The gas supply control unit 115 controls the gas supply unit 90 such that the supply of the gas is stopped in the first control which is performed in a part of the idle period. Further, the gas supply control unit 115 controls the gas supply unit 90 such that the supply of the gas is performed in the second control which is performed in a period, within the idle period, during which the first control is not performed. Furthermore, the gas supply control unit 115 may control the gas supply unit 90 such that the processing liquid 43 introduced in the gas supply line 93 flows to the processing tub 41 (such that a large amount of gas is supplied) or may control the gas supply unit 90 such that the processing liquid 43 introduced in the gas supply line 93 is slightly moved within the gas supply line (such that a small amount of gas is supplied). Here, it may be desirable that the movement of the processing liquid 43 is performed to the extent that the processing liquid 43 staying in the gas supply line and near the openings of the gas nozzles is moved from current positions to other positions. The gas supply control unit 115 may perform such an adjustment of the flow rate of the gas by controlling the flow rate controller 91b or the like.

The decompression control unit 116 is configured to control the decompression unit 95 according to the recipe stored in the recipe storage unit 111 such that the processing liquid within the processing tub 41 is introduced into the gas supply line 93 as the gas supply line 93 is decompressed. To elaborate, the decompression control unit 116 opens the opening valve 96 provided at the opening line 97 opened to the atmosphere such that the gas supply line 93 is decompressed and the gas is thus introduced from the gas supply line 93 into the opening line 97. Further, the decompression control unit 116 closes the opening valve 96 such that the gas flowing in the gas supply line 93 flows toward the gas nozzles 70. Furthermore, the decompression control unit 116 may open the opening valve 96 only in the second idle period transited from the processing liquid changing period and keep the opening valve 96 closed in the first idle period transited from the lot processing period. Accordingly, the introduction of the processing liquid 43 is actively performed in the second idle period as the opening valve 96 is opened, whereas the introduction of the processing liquid 43 is not performed actively in the first idle period. Therefore, the introduction amount of the processing liquid 43 in the second idle period becomes larger than the introduction amount of the processing liquid 43 in the first idle period.

[Substrate Liquid Processing Method]

Figure 4:
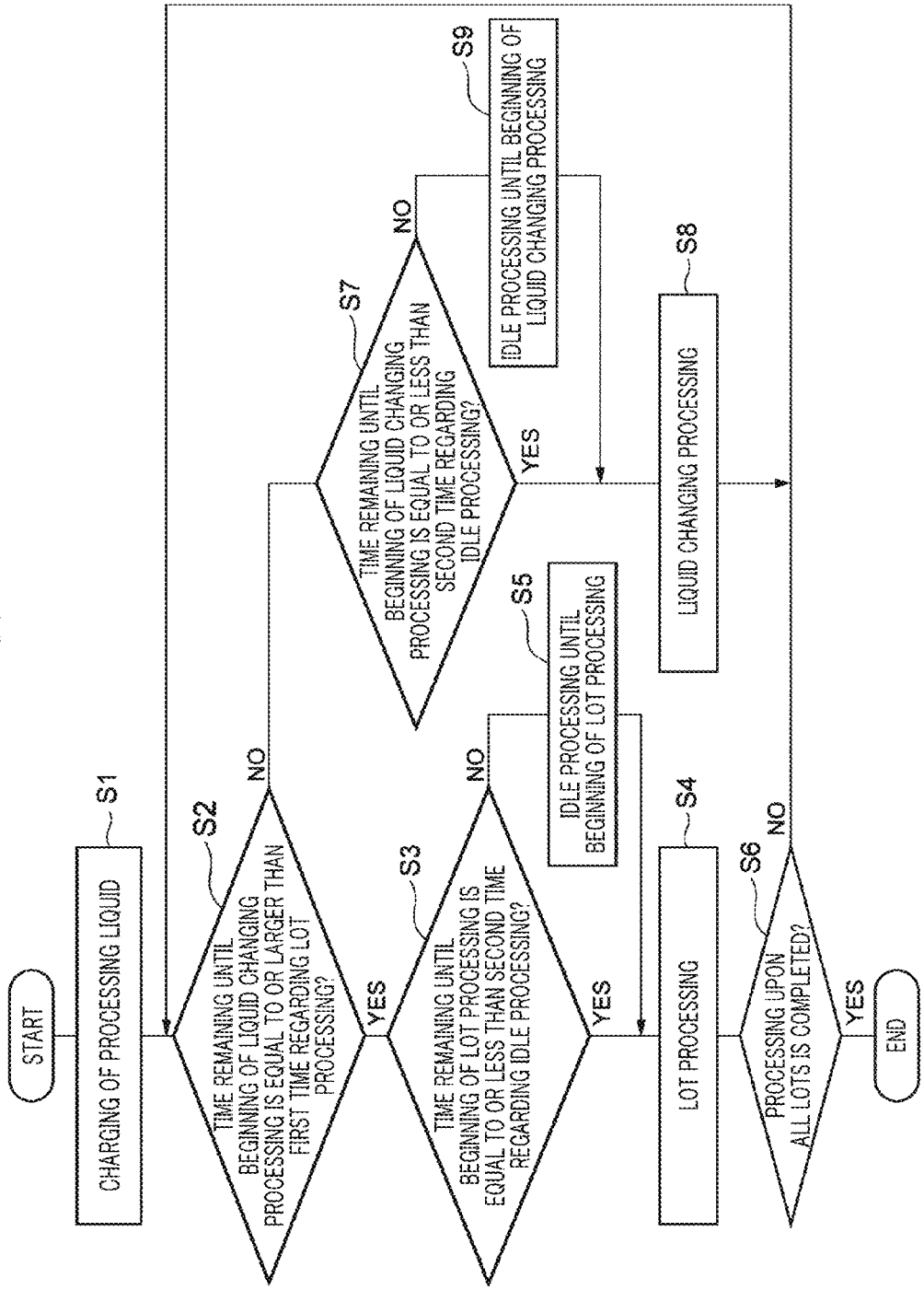
FIG. 4 is a flowchart showing a substrate processing sequence.

Now, a control sequence performed by the control unit 7 will be explained as an example of a substrate liquid processing method. As shown in FIG. 4, the control unit 7 first performs a process S1. The process S1 includes a charging control for the processing liquid 43. A more detailed sequence of the charging control will be elaborated later. Then, the control unit 7 performs a process S2. In the process S2, based on a processing schedule of the recipe stored in the recipe storage unit 111, it is determined whether a time remaining until the beginning of a next liquid changing processing is equal to or larger than a first time regarding the lot processing. Here, the first time regarding the lot processing is a time obtained by adding a preset buffer to a time required to perform the lot processing.

If it is determined in the process S2 that the remaining time until the beginning of the next liquid changing processing is equal to or larger than the first time (that is, the lot processing can be performed before the next liquid changing processing is begun), the control unit 7 performs a process S3. In the process S3, based on the processing schedule of the recipe stored in the recipe storage unit 111, it is determined whether a time remaining until the beginning of a next lot processing is equal to or less than a second time regarding the idle processing. Here, the second time regarding the idle processing is a time obtained by adding a preset buffer to a minimum processing time of the idle processing.

If it is determined in the process S3 that the time remaining until the beginning of the next lot processing is equal to or less than the second time (that is, the next lot processing is performed without performing the idle processing), the control unit 7 performs a process S4. The process S4 includes a lot processing control. A more detailed sequence of the lot processing control will be explained later. Further, the lot processing of the process S4 is begun at a start time of the lot processing, based on the processing schedule of the recipe stored in the recipe storage unit 111. On the other hand, if it is determined in the process S3 that the time remaining until the beginning of the next lot processing is not equal to or less than the second time, the control unit 7 performs the process S4 after performing a process S5. The process S5 includes an idle processing control. A more detailed sequence of the idle processing control will be described later.

Subsequent to the process S4, the control unit 7 performs a process S6. In the process S6, based on the processing schedule of the recipe stored in the recipe storage unit 111, it is determined whether the lot processing is completed upon all lots. If the lot processing on all of the lots is completed in the process S4, the substrate liquid processing is completed, whereas if the lot processing on all of the lots is not completed, the processing is repeated from the process S2.

Further, if it is determined in the process S2 that the time remaining until the beginning of the next liquid changing processing is not equal to or larger than the first time (that is, the lot processing cannot be performed before the liquid changing processing is begun), the control unit 7 performs a process S7. In the process S7, based on the processing schedule of the recipe stored in the recipe storage unit 111, it is determined whether the time remaining until the beginning of the next liquid changing processing is equal to or less than the second time regarding the idle processing.

If it is determined in the process S7 that the time remaining until the beginning of the liquid changing processing is equal to or less than the second time (that is, the next liquid changing processing is performed without performing the idle processing performed), the control unit 7 performs a process S8. The process S8 includes a liquid changing processing control. A more detailed sequence of the liquid changing processing control will be explained later. The liquid changing processing of the process S8 is begun at a liquid changing processing start time based on the processing schedule of the recipe stored in the recipe storage unit 111. If it is determined in the process S7 that the time remaining until the beginning of the liquid changing processing is not equal to or less than the second time, the control unit 7 performs the process S8 after performing a process S9. The process S9 includes an idle processing control. A more detailed sequence of the idle processing control will be discussed later. Upon the completion of the process S8, the processing is performed again from the process S2.

(Charging Sequence for Processing Liquid)

Figure 5:
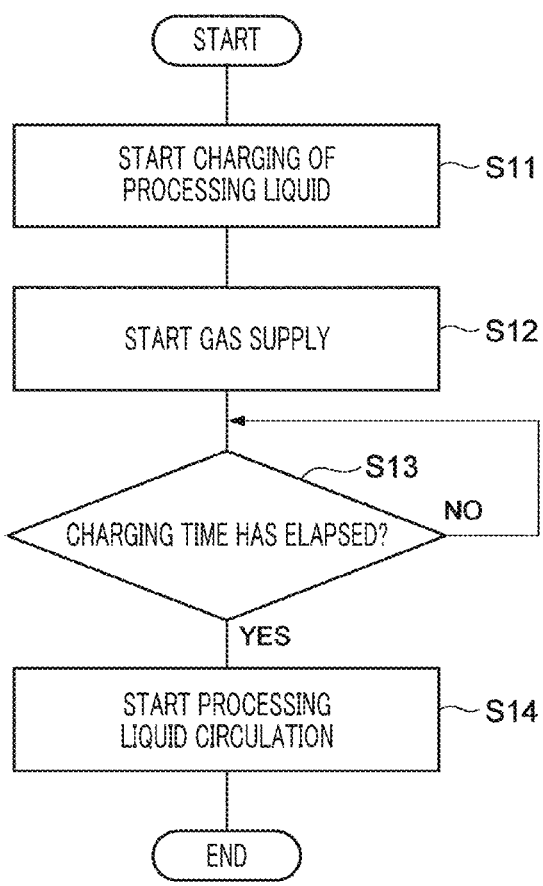
FIG. 5 is flowchart showing a processing liquid charging sequence.

Now, the detailed sequence of the charging control for the processing liquid 43 in the process S1 will be explained. At a time when the process S1 is begun, both the supply valve 92 provided at the gas supply line 93 and the opening valve 96 provided at the opening line 97 are kept closed. As depicted in FIG. 5, the control unit 7 first performs a process S11. In the process S11, the liquid supply control unit 112 controls the processing liquid supply unit 44 such that charging of the processing liquid 43 into the processing tub 41 is begun. To elaborate, the liquid supply control unit 112 controls the processing liquid supply unit 44 to start the supply of the processing liquid 43 into the outer tub 42 by opening the flow rate controller 46 in a state that the processing tub 41 is empty and the opening/closing valve 69 is closed, and to start the introduction of the processing liquid 43 into the processing tub 41 from the outer tub 42 by driving the supply pump 52.

Subsequently, the control unit 7 performs a process S12. In the process S12, the gas supply control unit 115 opens the supply valve 92, so that the supply of the gas into the gas supply line 93 is begun. Then, the control unit 7 performs a process S13. In the process S13, based on the processing schedule of the recipe stored in the recipe storage unit 111, it is determined whether a predetermined charging time has elapsed. The predetermined charging time is a time required for the processing liquid 43 to be charged in the processing tub 41 in an enough amount to perform a lot processing in the processing tub 41.

In the process S13, the processing of the process S13 is repeatedly performed until the predetermined charging time elapses, and if the predetermined charging time passes by, the control unit 7 performs a process S14. In the process S14, the liquid supply control unit 112 starts a circulation control for the processing liquid 43. The circulation control for the processing liquid 43 includes controlling the processing liquid supply unit 44 to keep on driving the supply pump 52 to allow the processing liquid 43 overflown into the outer tub 42 from the processing tub 41 to be returned back into the lower portion of the processing tub 41. In this circulation control, the liquid supply control unit 112 may control the processing liquid supply unit 44 to adjust the opening degree of the flow rate controller 48 for the pure water based on a concentration of the processing liquid 43 detected by the concentration sensor 58. Through these processes, the process S1 is completed.

(Lot Processing Sequence)

Figure 6:
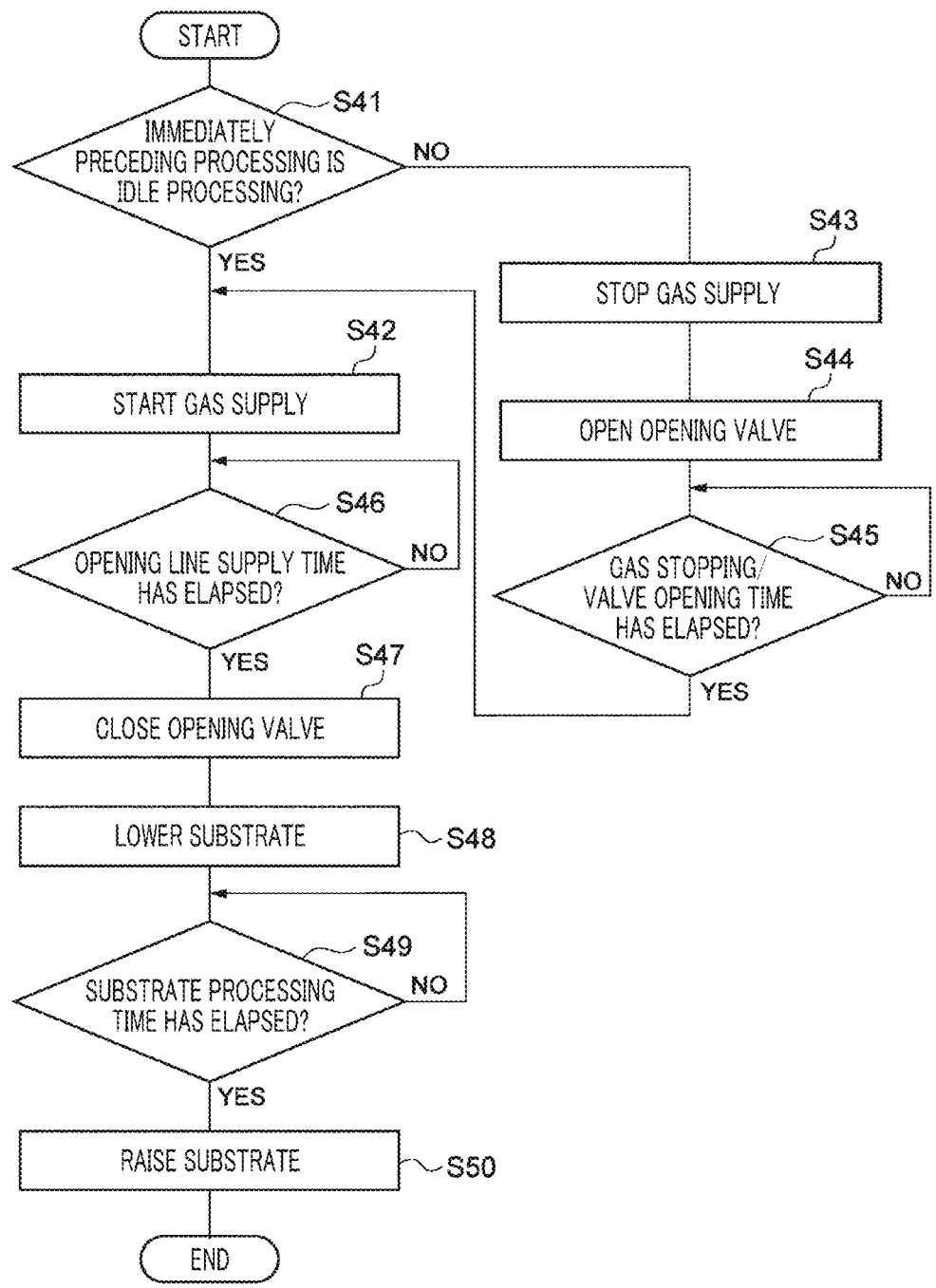
FIG. 6 is a flowchart showing a lot processing sequence.

Now, the detailed sequence of the lot processing control in the aforementioned process S4 will be explained with reference to FIG. 6 and FIG. 11. As depicted in FIG. 6, the control unit 7 first performs a process S41. In the process S41, based on the processing schedule of the recipe stored in the recipe storage unit 111, it is determined whether a processing performed immediately before the process S41 (hereinafter, referred to as "immediately preceding processing") is the idle processing. This processing of the process S41 is performed because a processing to be performed differs depending on the content of the immediately preceding processing on the basis of a premise that "the gas supply is stopped and the opening valve 96 is in an open state when the immediately preceding processing is the idle processing, whereas the gas is supplied and the opening valve 96 is in a closed state when the immediately preceding processing is the lot processing or the liquid changing processing other than the idle processing". Further, in the description of the present exemplary embodiment, though the gas supply is stopped and the opening valve 96 is opened at the moment when the idle processing is finished, the present disclosure is not limited thereto. At the moment the idle processing is ended, the gas may be still being supplied and the opening valve 96 may be in the closed state, as in a case where the immediately preceding processing is the lot processing or the like. In such a case, in the lot processing control, processes S43 to S45 may be first performed, and, then, a process S42 and the subsequent processes may be performed.

If it is determined in the process S41 that the immediately preceding processing is the idle processing (there is created a state shown in FIG. 11A), the control unit 7 performs the process S42. In the process S42, the gas supply control unit 115 controls the gas supply unit 90 to start the gas supply. To elaborate, the gas supply control unit 115 opens the supply valve 92 such that the gas is supplied into the gas supply line 93 (see FIG. 11B). As the supply valve 92 is opened in the state that the opening valve 96 is open, the gas supplied from the gas supply unit 90 is introduced into the opening line 97 from the gas supply line 93.

Meanwhile, if it is determined in the process S41 that the immediately preceding processing is not the idle processing, the control unit 7 performs the process S42 after performing the processes S43 to S45. In the process S43, the gas supply control unit 115 controls the gas supply unit 90 to stop the gas supply. To elaborate, the gas supply control unit 115 closes the supply valve 92 such that the gas supply into the gas supply line 93 is stopped. In the process S44, the decompression control unit 116 controls the decompression unit 95 such that the gas supply line 93 is decompressed and the processing liquid 43 within the processing tub 41 is thus introduced into the gas supply line 93. To elaborate, the decompression control unit 116 opens the opening valve 96 such that the gas supply line 93 is decompressed and the gas is thus introduced from the gas supply line 93 into the opening line 97. In the process S45, based on the processing schedule of the recipe stored in the recipe storage unit 111, it is determined whether a preset gas stopping/valve opening time has elapsed after the gas supply is stopped and the opening valve 96 is opened. The preset gas stopping/valve opening time is a time required for a sufficient amount of the processing liquid 43 to be introduced into the gas supply line 93 up to a predetermined height. The processing of the process S45 is repeatedly performed until the preset gas stopping/valve opening time passes by in the process S45. With a lapse of the preset gas stopping/valve opening time, the control unit 7 performs the process S42 as stated above.

After the process S42 is performed, the control unit 7 performs a process S46. In the process S46, based on the processing schedule of the recipe stored in the recipe storage unit 111, it is determined whether a preset opening line supply time has elapsed after the gas supply into the opening line 97 is begun in the process S42. For example, the preset opening line supply time is a time required to supply the gas in an enough amount to remove water droplets and vapor staying in the opening line 97 from the opening line 97. By way of example, the preset opening line supply time may be about 10 seconds.

In the process S46, the processing of the process S46 is repeated until the preset opening line supply time elapses. If the preset opening line supply time passes by, the control unit 7 performs a process S47. In the process S47, the decompression control unit 116 closes the opening valve 96 (see FIG. 11C). Accordingly, the gas supplied from the gas supply unit 90 is not introduced into the opening line 97 but is flown toward the gas nozzles 70 and supplied into the processing liquid 43 within the processing tub 41 from the openings of the gas nozzles 70. In this state, an upward flow of the processing liquid 43 is generated in the processing tub 41.

Subsequently, the control unit 7 performs a process S48. In the process S48, the immersion control unit 114 controls the substrate elevating device 32 to lower a plurality of supporting arms (not shown) from the height where the substrates 8 belonging to the single lot are located higher than the liquid surface of the processing liquid 43 to the height where the substrates 8 are immersed in the processing liquid 43 (see FIG. 11D).

Then, the control unit 7 performs a process S49. In the process S49, based on the processing schedule of the recipe stored in the recipe storage unit 111, it is determined whether a predetermined substrate processing time has elapsed after the substrates are immersed in the processing liquid 43. Here, the predetermined substrate processing time is set based on the cleaning degree required. The processing of the process S49 is repeated until the predetermined substrate processing time elapses in the process S49. If the predetermined substrate processing time passes by, the control unit 7 performs a process S50. In the process S50, the immersion control unit 114 controls the substrate elevating device 32 to raise the supporting arms (not shown) from the height where the substrates 8 are immersed in the processing liquid 43 up to the height where the substrates 8 are located higher than the liquid surface of the processing liquid 43. Through the above-described operations, the process S4 is completed.

(Liquid Changing Processing Sequence)

Figure 7:
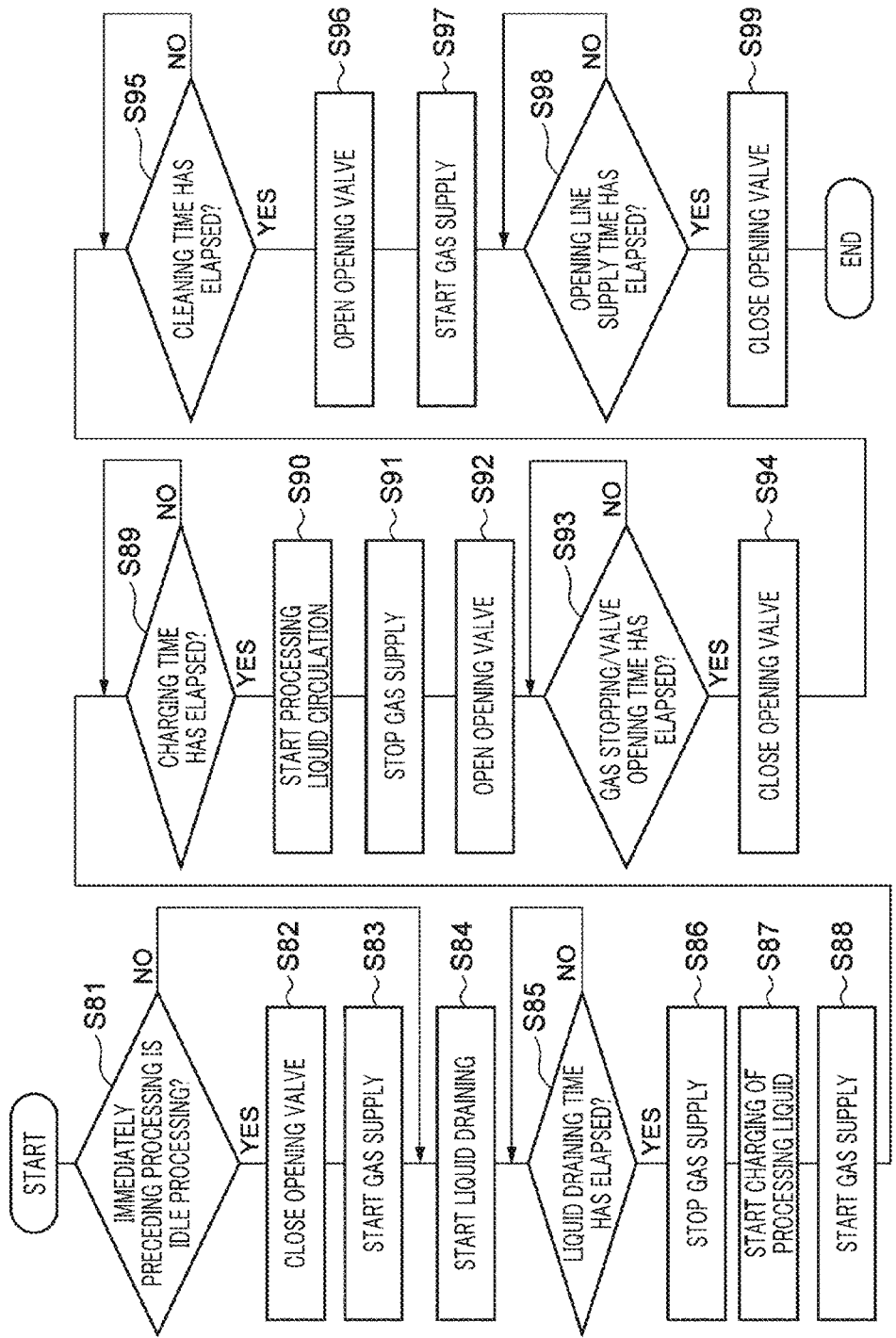
FIG. 7 is a flowchart showing a liquid changing processing sequence.

Now, the detailed sequence of the liquid changing processing control in the process S8 will be discussed with reference to FIG. 7 and FIG. 12A to FIG. 12H. As depicted in FIG. 7, the control unit 7 first performs a process S81. In the process S81, based on the processing schedule of the recipe stored in the recipe storage unit 111, it is determined whether the immediately preceding processing is an idle processing. If it is determined in the process S81 that the immediately preceding processing is the idle processing (there is created a state shown in FIG. 12A), the control unit 7 performs a process S82 and a process S83. In the process S82, the decompression control unit 116 closes the opening valve 96. In the process S83, the gas supply control unit 115 opens the supply valve 92 such that the gas is supplied into the gas supply line 93.

If it is determined in the process S81 that the immediately preceding processing is not the idle processing or after the process S83 is completed, the control unit 7 performs a process S84. In the process S84, the liquid drain control unit 113 controls the processing liquid drain unit 67 to start the draining of the processing liquid 43 from the processing tub 41 (see FIG. 12B). To elaborate, the liquid drain control unit 113 closes the flow rate controller 46 and the flow rate controller 48 such that the supply of the processing liquid 43 and the supply of the pure water are stopped, and turns the opening valve 69 into the open state from the closed state such that the draining of the processing liquid 43 from the processing tub 41 is begun.

Thereafter, the control unit 7 performs a process S85. In the process S85, based on the processing schedule of the recipe stored in the recipe storage unit 111, it is determined whether a preset liquid draining time has elapsed after the draining is begun. The preset liquid draining time is a time required for the processing liquid 43 within the processing tub 41 to be drained completely. In the process S85, the processing of the process S85 is repeatedly performed until the preset liquid draining time elapses. If the preset liquid draining time passes by, the control unit 7 performs a process S86. In the process S86, the gas supply control unit 115 closes the supply valve 92 such that the gas supply into the gas supply line 93 is stopped (see FIG. 12C). As stated above, the gas supply is begun from the process S83 prior to the timing (process S84) when the liquid draining is started, and this gas supply is continued until the liquid draining is completed as the liquid draining time passes by. Therefore, even in case that the before-changed processing liquid 43 remains in the gas supply line 93, the before-changed processing liquid 43 remaining in the gas supply line 93 can be securely removed from the gas supply line 93 by the time when the liquid draining is completed. Thus, the processing liquid 43 before changed and the processing liquid 43 after changed can be suppressed from being mixed in the processing tub 41. Furthermore, the timings for starting and stopping the gas supply may not be limited to the aforementioned examples, and the gas supply may be begun and stopped at any times other than the aforementioned times as long as the before-changed processing liquid 43 can be drained from the gas supply line 93 before the new after-changed processing liquid 43 is charged.

Subsequently, the control unit 7 performs a process S87. In the process S87, the liquid supply control unit 112 controls the processing liquid supply unit 44 to start the charging of the processing liquid 43 into the processing tub 41. By way of example, the liquid supply control unit 112 controls the processing liquid supply unit 44 to start the supply of the processing liquid 43 into the outer tub 42 by opening the flow rate controller 46 in the state that the processing tub 41 is empty and the opening/closing valve 69 is closed, and to start the introduction of the processing liquid 43 into the processing tub 41 from the outer tub 42 by driving the supply pump 52.

Subsequently, the control unit 7 performs a process S88. In the process S88, the gas supply control unit 115 opens the supply valve 92 so that the gas supply into the gas supply line 93 is begun (see FIG. 12D). Then, the control unit 7 performs a process S89. In the process S89, based on the processing schedule of the recipe stored in the recipe storage unit 111, it is determined whether a predetermined charging time has elapsed. The predetermined charging time is a time required for the processing liquid 43 to be charged in the processing tub 41 in an enough amount to perform a lot processing in the processing tub 41.

The processing of the process S89 is repeatedly performed until the predetermined charging time elapses in the process S89, and if the predetermined charging time passes by, the control unit 7 performs a process S90. In the process S90, the liquid supply control unit 112 starts the circulation control for the processing liquid 43. The circulation control for the processing liquid 43 includes controlling the processing liquid supply unit 44 to keep on driving the supply pump 52 to allow the processing liquid 43 overflown into the outer tub 42 from the processing tub 41 to be returned back into the lower portion of the processing tub 41. In this circulation control, the liquid supply control unit 112 may control the processing liquid supply unit 44 to adjust the opening degree of the flow rate controller 48 for the pure water based on the concentration of the processing liquid 43 detected by the concentration sensor 58.

Then, the control unit 7 performs a process S91. In the process S91, the gas supply control unit 115 closes the supply valve 92 such that the gas supply is stopped. Afterwards, the control unit 7 performs a process S92. In the process S92, the decompression control unit 116 opens the opening valve 96 such that the gas supply line 93 is decompressed and the processing liquid 43 within the processing tub 41 is thus introduced into the gas supply line 93 (see FIG. 12E). Then, the control unit 7 performs a process S93. In the process S93, based on the processing schedule of the recipe stored in the recipe storage unit 111, it is determined whether a preset gas stopping/valve opening time has elapsed after the gas supply is stopped and the opening valve 96 is opened. The preset gas stopping/valve opening time is a time required for a sufficient amount of the processing liquid 43 to be introduced into the gas supply line 93 up to a predetermined height. In the state that the processing liquid 43 is introduced in the gas supply line 93, the processing liquid is sucked in the gas nozzles 70 at least.

The processing of the process S93 is repeatedly performed until the preset gas stopping/valve opening time passes by in the process S93, and if the preset gas stopping/valve opening time elapses, the control unit 7 performs a process S94. In the process S94, the decompression control unit 116 closes the opening valve 96 (see FIG. 12F). Thereafter, the control unit 7 performs a process S95. In the process S95, based on the processing schedule of the recipe stored in the recipe storage unit 111, it is determined whether a predetermined cleaning time has elapsed after the opening valve 96 is closed. The preset cleaning time is set to obtain a sufficient cleaning effect upon the gas nozzles 70 by the processing liquid 43 sucked into the gas nozzles 70.

The processing of the process S95 is repeatedly performed until the predetermined cleaning time passes by in the process S95. Upon the lapse of the predetermined cleaning time, the control unit 7 performs a process S96. In the process S96, the decompression control unit 116 opens the opening valve 96. Then, the control unit 7 performs a process S97. In the process S97, the gas supply control unit 115 opens the supply valve 92 such that the gas is supplied into the opening line 97 (see FIG. 12G).

Subsequently, the control unit 7 performs a process S98. In the process S98, based on the processing schedule of the recipe stored in the recipe storage unit 111, it is determined whether a preset opening line supply time has elapsed after the gas supply into the opening line 97 is begun in the process S97. For example, the preset opening line supply time is a time required to supply the gas in an enough amount to remove water droplets and vapor staying in the opening line 97 from the opening line 97. By way of example, the preset opening line supply time may be about 10 seconds.

In the process S98, the processing of the process S98 is repeated until the preset opening line supply time elapses. Upon the lapse of the preset opening line supply time, the control unit 7 performs a process S99. In the process S99, the decompression control unit 116 closes the opening valve 96 (see FIG. 12H). Accordingly, the gas supplied from the gas supply unit 90 is not introduced into the opening line 97 but flown toward the gas nozzles 70. Through the above-described operations, the process S8 is completed.

(Idle Processing Sequence)

Figure 8:
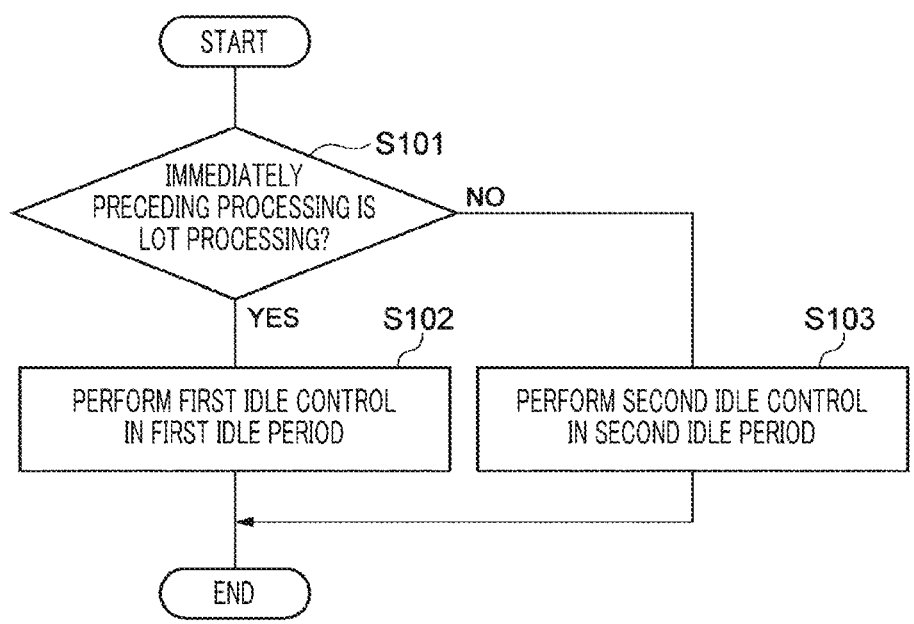
FIG. 8 is a flowchart showing an idle processing sequence.

Now, the detailed sequence of the idle processing control in the processes S5 and S9 will be explained with reference to FIG. 8. As depicted in FIG. 8, the control unit 7 first performs a process S101. In the process S101, based on the processing schedule of the recipe stored in the recipe storage unit 111, it is determined whether the immediately preceding processing is a lot processing. This determination is made to perform a control of reducing an introduction amount of the processing liquid 43 into the gas supply line 93 (to be more specific, not introducing the processing liquid 43 actively) in case that the immediately preceding processing is the lot processing because the processing liquid is contaminated, as compared to a case where the immediately preceding processing is not the lot processing.

If it is determined in the process S101 that the immediately preceding processing is the lot processing, the control unit 7 performs a process S102. In the process S102, the control unit 7 performs the first idle control as an example of the first control, assuming that the corresponding idle period is the first idle period. Meanwhile, if it is determined in the process S101 that the immediately preceding processing is not the lot processing (specifically, if the immediately preceding processing is the liquid changing processing), the control unit 7 performs a process S103. In the process S103, the control unit 7 performs the second idle control as an example of the first control, assuming that the corresponding idle period is the second idle period.

Figure 9:
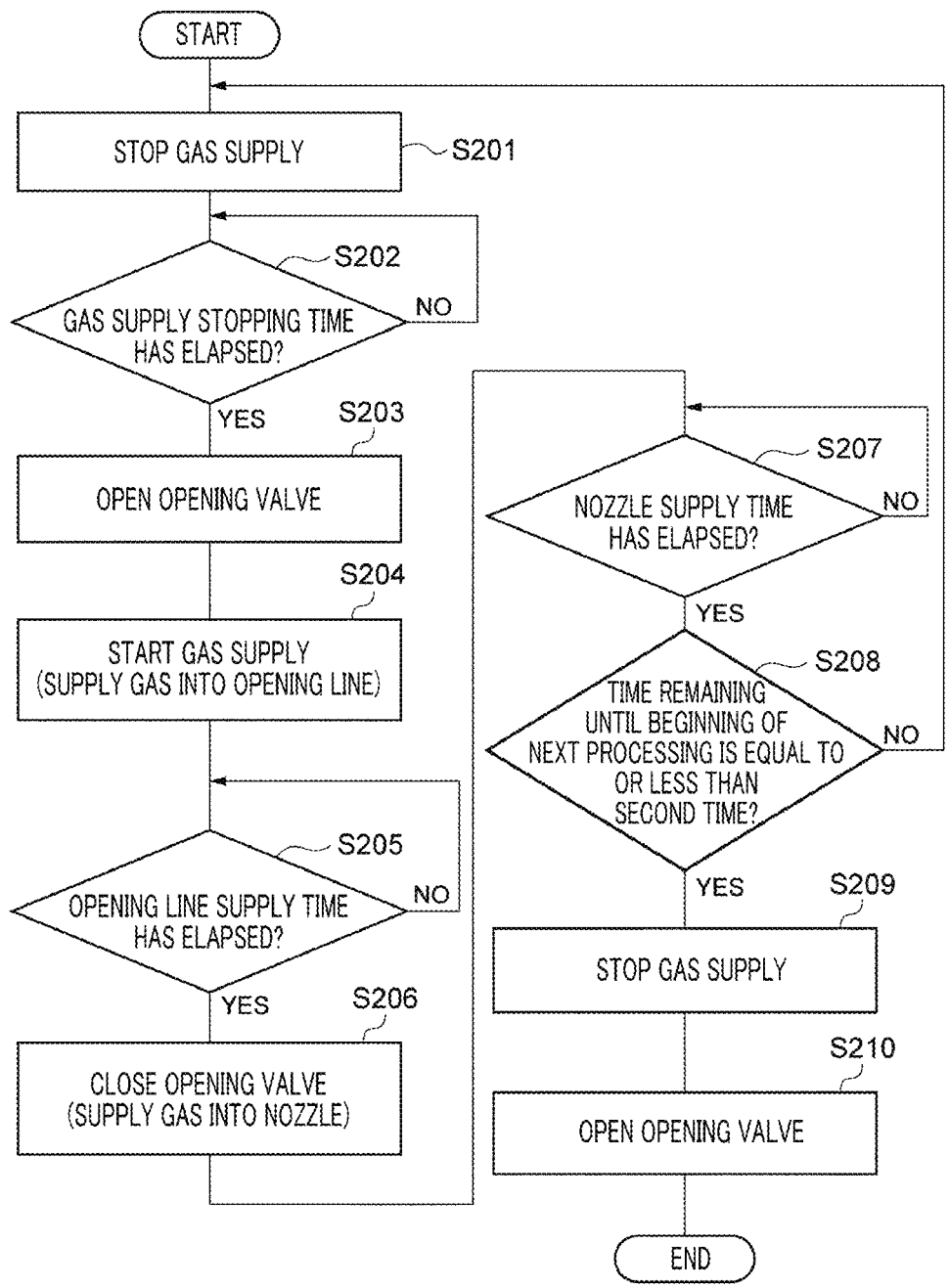
FIG. 9 is a flowchart showing a first idle control in a first idle period.

Now, the detailed sequence of the first idle control (a control over the first idle processing in the first idle period which is an idle period when the immediately preceding processing is the lot processing) in the process S102 will be discussed with reference to FIG. 9. As depicted in FIG. 9, the control unit 7 first performs a process S201. In the process S201, the gas supply control unit 115 closes the supply valve 92 such that the gas supply is stopped. Then, the control unit 7 performs a process S202. In the process S202, based on the processing schedule of the recipe stored in the recipe storage unit 111, it is determined whether a preset gas supply stopping time has elapsed after the gas supply is stopped. The preset gas supply stopping time is a time required for the upward flow, which is formed within the processing tub 41 when the gas is being supplied, to be weakened sufficiently. Accordingly, as it becomes difficult for the flow of the processing liquid to be generated within the processing tub 41, the generation of the crystal at a certain place (the edges of the openings of the gas nozzles 70, and so forth) can be suppressed.

Then, the control unit 7 performs a process S203. In the process S203, the decompression control unit 116 opens the opening valve 96. Subsequently, the control unit 7 performs a process S204. In the process S204, the gas supply control unit 115 opens the supply valve 92 such that the gas is supplied into the opening line 97.

Afterwards, the control unit 7 performs a process S205. In the process S205, based on the processing schedule of the recipe stored in the recipe storage unit 111, it is determined whether a preset opening line supply time has elapsed after the gas supply into the opening line 97 is begun in the process S204. For example, the preset opening line supply time is a time required to supply the gas in an enough amount to remove water droplets and vapor staying in the opening line 97 from the opening line 97. By way of non-limiting example, the preset opening line supply time may be about 10 seconds.

In the process S205, the processing of the process S205 is repeated until the preset opening line supply time elapses. If the preset opening line supply time passes by, the control unit 7 performs a process S206. In the process S206, the decompression control unit 116 closes the opening valve 96. Accordingly, the gas supplied from the gas supply unit 90 is not introduced into the opening line 97 but flown toward the gas nozzles 70. Then, the gas is discharged from the openings of the gas nozzles 70, causing bubbling of the processing liquid 43 within the processing tub 41. As a result, the upward flow of the processing liquid 43 is created within the processing tub 41.

Thereafter, the control unit 7 performs a process S207. In the process S207, based on the processing schedule of the recipe stored in the recipe storage unit 111, it is determined whether a predetermined nozzle supply time has elapsed from the beginning of the gas supply into the gas nozzles 70. Here, the predetermined nozzle supply time is an enough time to create the upward flow of the processing liquid 43 within the processing tub 41 by the bubbling of the processing liquid within the processing tub 41.

In the process S207, the processing of the process S207 is repeatedly performed until the predetermined nozzle supply time elapses. Upon the lapse of the predetermined nozzle supply time, the control unit 7 performs a process S208. In the process S208, based on the processing schedule of the recipe stored in the recipe storage unit 111, it is determined whether a time remaining until the beginning of a next processing is equal to or less than the second time regarding the idle processing. Here, the second time regarding the idle processing is a time obtained by adding the preset buffer to the minimum processing time of the idle processing.

If it is determined in the process S208 that the time remaining until the beginning of the next processing is not equal to or less than the second time (that is, the processes S201 to S208 of the first idle processing is performed again until the beginning of the next processing), the control unit 7 performs the processings from the process S201 again. Meanwhile, if it is determined in the process S208 that the time remaining until the beginning of the next processing is equal or less than the second time (that is, the next processing would be performed without performing the first idle processing again), the control unit 7 performs a process S209. In the process S209, the gas supply control unit 115 closes the supply valve 92 such that the gas supply is stopped. Then, the control unit 7 performs a process S210. In the process S210, the decompression control unit 116 opens the opening valve 96. Through the above-described operations, the aforementioned process S102 is completed.

Figure 10:
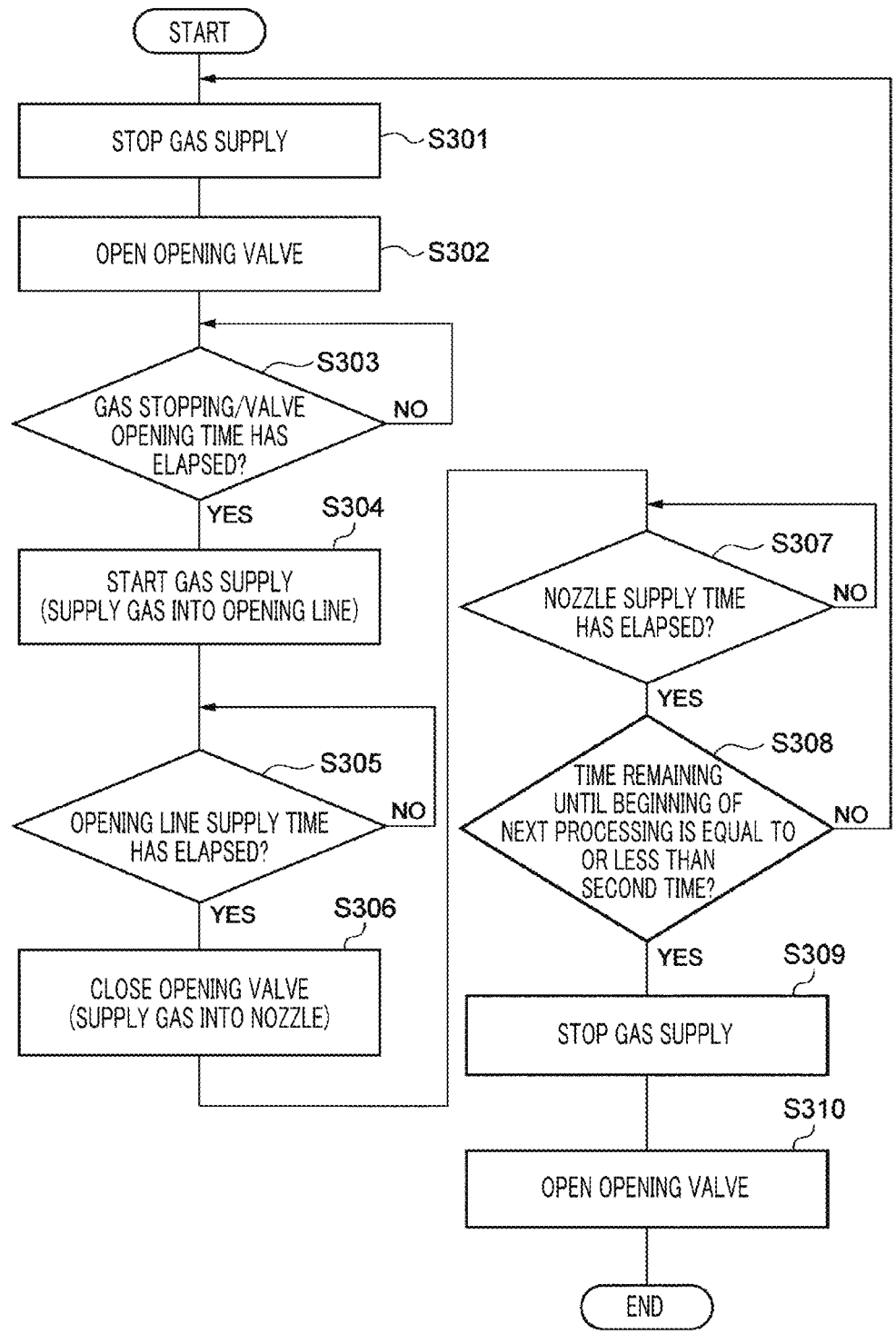
FIG. 10 is a flowchart showing a second idle control in a second idle period.
Figure 11A:
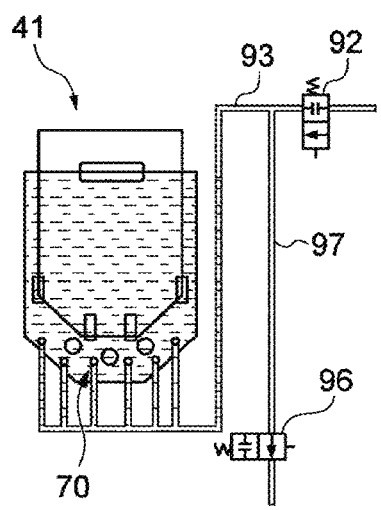
FIG. 11A to FIG. 11D are diagrams for describing the lot processing sequence.
Figure 11B:
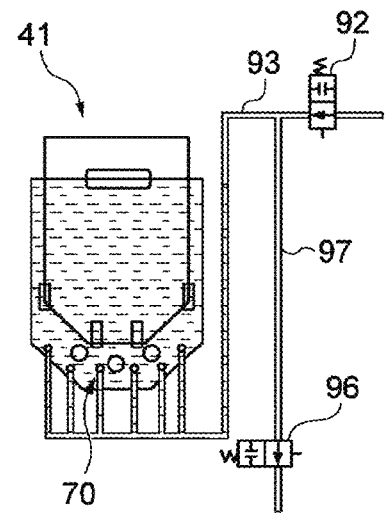
Figure 11C:
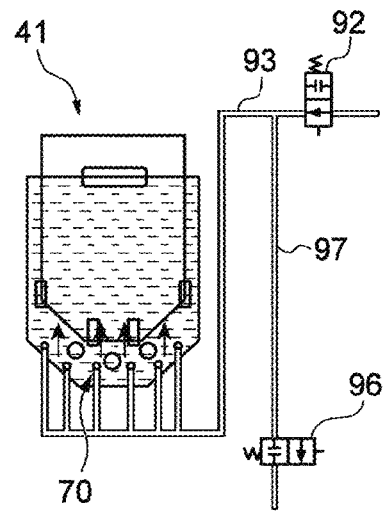
Figure 11D:
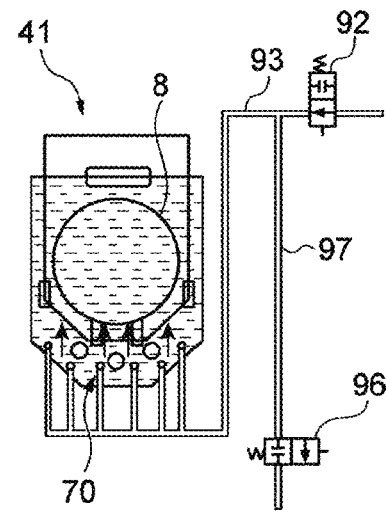
Figure 13A:
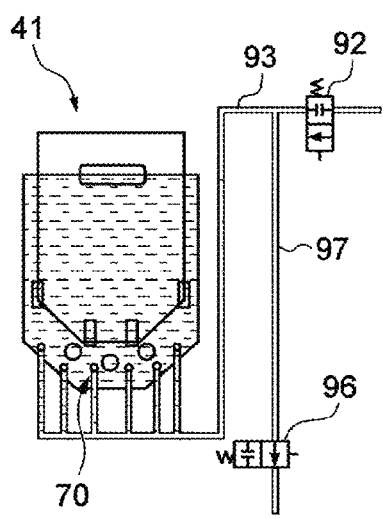
FIG. 13A to FIG. 13D are diagrams for describing the second idle control.
Figure 13B:
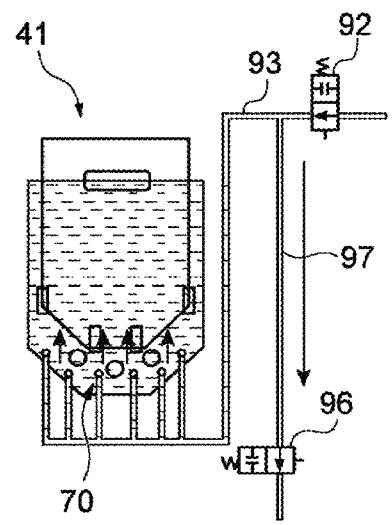
Figure 13C:
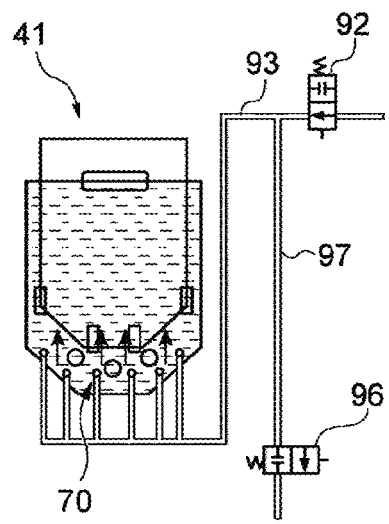
Figure 13D:
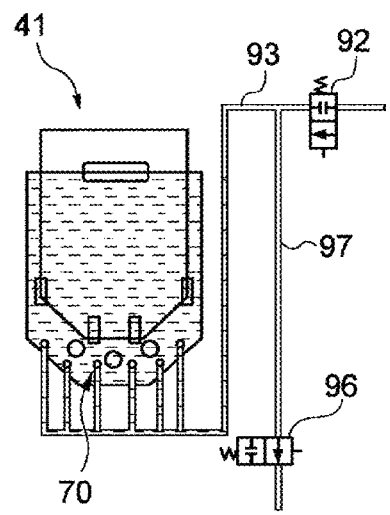

Subsequently, a detailed sequence of the second idle control (a control over the second idle processing in the second idle period which is an idle period when the immediately preceding processing is not the lot processing but the liquid changing processing) in the process S103 will be described with reference to FIG. 10 and FIG. 13A to FIG. 13D. As depicted in FIG. 10, the control unit 7 first performs a process S301. In the process S301, the gas supply control unit 115 closes the supply valve 92 such that the gas supply is stopped. Subsequently, the control unit 7 performs a process S302. In the process S302, the decompression control unit 116 opens the opening valve 96. Accordingly, the gas supply line 93 is decompressed, so that the introduction of the processing liquid 43 into the gas supply line 93 is begun (see FIG. 13A). As stated above, in a part of the idle period, the control in which the gas supply unit 90 is controlled such that the gas supply is stopped and the decompression unit 95 is controlled such that the processing liquid 43 is introduced into the gas supply line 93 is the first control.

Then, the control unit 7 performs a process S303. In the process S303, based on the processing schedule of the recipe stored in the recipe storage unit 111, it is determined whether a preset gas stopping/valve opening time has elapsed after the gas supply is stopped and the opening valve 96 is opened. The preset gas stopping/valve opening time is a time required for a sufficient amount of the processing liquid 43 to be introduced into the gas supply line 93 up to a predetermined height. In the process S303, the processing of the process S303 is repeatedly performed until the preset gas stopping/valve opening time passes by. Upon the lapse of the preset gas stopping/valve opening time, the control unit 7 performs a process S304. In the process S304, the gas supply control unit 115 opens the supply valve 92 such that the gas is supplied into the opening line 97 (see FIG. 13B). As stated above, the control in which the gas supply unit 90 is controlled to perform the gas supply is the second control. To be more specific, the corresponding control in which the decompression unit 95 is controlled such that the gas flowing in the gas supply line 93 is introduced into the opening line 97 is the third control belonging to the second control.

Thereafter, the control unit 7 performs a process S305. In the process S305, based on the processing schedule of the recipe stored in the recipe storage unit 111, it is determined whether a preset opening line supply time has elapsed after the gas supply into the opening line 97 is begun in the process S304. For example, the preset opening line supply time is a time required to supply the gas in an enough amount to remove water droplets and vapor staying in the opening line 97 from the opening line 97. By way of example, the preset opening line supply time may be about 10 seconds.

In the process S305, the processing of the process S305 is repeated until the preset opening line supply time elapses. If the preset opening line supply time passes by, the control unit 7 performs a process S306. In the process S306, the decompression control unit 116 closes the opening valve 96 (see FIG. 13C). Accordingly, the gas supplied from the gas supply unit 90 is not introduced into the opening line 97 but flown toward the gas nozzles 70. As stated above, the control in which the decompression unit 95 is controlled such that the gas flowing in the gas supply line 93 is flown toward the gas nozzles 70 is the fourth control belonging to the second control.

Here, as the above-stated fourth control, the control unit 7 performs: a fifth control of controlling the gas supply unit 90 such that the all of the processing liquid 43 introduced into the gas supply line 93 flows into the processing tub 41; and a sixth control of controlling the gas supply unit 90 such that the processing liquid 43 introduced into the gas supply line 93 is slightly moved within the gas supply line 93. In the fifth control, the gas is discharged from the openings of the gas nozzles 70, making the processing liquid 43 within the processing tub 41 to bubble therein and creating the upward flow of the processing liquid 43 within the processing tub 41. In the sixth control, the processing liquid 43 of the gas supply line 93 is not flown into the processing tub 41 but is slightly moved within the gas supply line 93. For example, after repeating the sixth control of allowing the processing liquid 43 to be slightly moved within the gas supply line 93 multiple times, the control unit 7 performs the fifth control of allowing the processing liquid 43 introduced in the gas supply line 93 to be flown into the processing tub 41. By way of example, the gas supply control unit 115 adjusts the flow rate controller 91*b* such that a gas supply amount in the fifth control is larger than a gas supply amount in the sixth control. Further, the gas supply control unit 115 adjusts the flow rate controller 91*b* (or the supply valve 92) such that a gas supply time in the fifth control is longer than a gas supply time in the sixth control, for example.

Thereafter, the control unit 7 performs a process S307. In the process S307, based on the processing schedule of the recipe stored in the recipe storage unit 111, it is determined whether a predetermined nozzle supply time has elapsed from the beginning of the gas supply into the gas nozzles 70. Here, the predetermined nozzle supply time is an enough time to create the upward flow of the processing liquid 43 within the processing tub 41 by allowing the processing liquid within the processing tub 41 to bubble therein. Further, for example, this predetermined nozzle supply time may be an enough time to perform the fifth control after the aforementioned sixth control is repeated multiple times.

In the process S307, the processing of the process S307 is repeatedly performed until the predetermined nozzle supply time elapses. Upon the lapse of the predetermined nozzle supply time, the control unit 7 performs a process S308. In the process S308, based on the processing schedule of the recipe stored in the recipe storage unit 111, it is determined whether a time remaining until the beginning of a next processing is equal to or less than the second time regarding the idle processing. Here, the second time regarding the idle processing is a time obtained by adding a preset buffer to the minimum processing time of the idle processing.

If it is determined in the process S308 that the time remaining until the beginning of the next processing is not equal to or less than the second time (that is, the processes S301 to S308 of the second idle processing is performed again until the beginning of the next processing), the control unit 7 performs these processings again from the process S301. Meanwhile, if it is determined in the process S308 that the remaining time until the beginning of the next processing is equal or less than the second time (that is, the next processing would be performed without performing the second idle processing again), the control unit 7 performs a process S309. In the process S309, the gas supply control unit 115 closes the supply valve 92 such that the gas supply is stopped. Then, the control unit 7 performs a process S310. In the process S310, the decompression control unit 116 opens the opening valve 96 (see FIG. 13D). Through the above-described operations, the process S103 is completed.

[Effects of Exemplary Embodiments]

As stated above, the substrate liquid processing apparatus A1 includes the processing tub 41 configured to accommodate therein the processing liquid 43 and the substrates 8; the gas nozzles 70 configured to discharge the gas into the lower portion within the processing tub 41; the gas supply unit 90 configured to supply the gas; the gas supply line 93 configured to connect the gas nozzles 70 and the gas supply unit 90; the decompression unit 95 configured to introduce the processing liquid 43 within the processing tub 41 into the gas supply line 93 by decompressing the gas supply line 93; and the control unit 7 configured to perform the first control of controlling the gas supply unit 90 to stop the supply of the gas and the decompression unit 95 to introduce the processing liquid 43 into the gas supply line 93 in the part of the idle period in which the substrates 8 are not accommodated in the processing tub 41.

In the substrate liquid processing apparatus A1, in a part of the idle period, the supply of the gas into the gas nozzles 70 is stopped and the processing liquid 43 within the processing tub 41 is introduced into the gas supply line 93 as the gas supply line 93 is decompressed. In the processing tub 41 where the substrates 8 are processed, the gas is supplied from the gas nozzles 70 which are typically provided at the lower portion of the processing tub 41 to maintain the state of the processing liquid 43 uniform. By the supply of the gas, the upward flow of the processing liquid 43 is generated within the processing tub 41 in a stable manner. As a result, it becomes easier to maintain the state of the processing liquid 43 uniform. However, stay of the processing liquid 43 may become easier to occur at a certain place due to this flow of the gas. To elaborate, the stay of the processing liquid 43 at the edges of the openings of the gas nozzles 70 may easily occur due to a turbulence of the gas flow. For this reason, crystals of components eluted from the substrates 8 and the various kinds of pipelines may be generated at the edges of the openings of the gas nozzles 70, and these crystals may become a hindrance to the gas discharge. To resolve this problem, in the substrate liquid processing apparatus A1 according to the exemplary embodiment, the gas supply is stopped and the processing liquid 43 is introduced into the gas supply line 93 in the part of the idle period during which the substrate processing is not performed. As the gas supply is stopped, it becomes difficult for the flow of the processing liquid to be created within the processing tub 41, so that the generation of the crystals at the certain place (at the edges of the openings of the gas nozzles 70, etc.) can be suppressed. Further, as the processing liquid 43 is introduced into the gas supply line 93, the crystals at the edges of the openings of the gas nozzles 70 are introduced into the gas supply line 93 along with the processing liquid 43. As a result, the crystals are removed from the edges of the openings of the gas nozzles 70, so that the gas can be appropriately discharged from the gas nozzles 70.

Referring to FIG. 14A and FIG. 14B, an example flow of a processing of the substrate liquid processing apparatus A1 will be explained in comparison with a flow of a processing of a substrate liquid processing apparatus according to a comparative example. FIG. 14A illustrates an example flow of the processing of the substrate liquid processing apparatus according to the comparative example. FIG. 14B shows an example flow of the processing of the substrate liquid processing apparatus A1 according to the present exemplary embodiment. In both drawings, an idle period ranging from a time t1 to a time t3, a lot processing period ranging from the time t3 to a time t4, a processing liquid changing period ranging from the time t4 to a time t6 and an idle period ranging from the time t6 to a time t7 are arranged in this sequence in a time series. By way of example, in the substrate liquid processing apparatus according to the comparative example of FIG. 14A, a $N_2$ gas is constantly supplied in the idle period from the time t1 to the time t3 and in the idle period from the time t6 to the time t7. Meanwhile, in the substrate liquid processing apparatus A1 according to the present exemplary embodiment of FIG. 14B, there exists a period in which the $N_2$ gas is not supplied (that is, the gas supply is stopped) in the idle period of the times t1 to t3 and the idle period of the times t6 to t7. To be specific, in the idle period of the times t1 to t3, the $N_2$ gas is not supplied until a time t2 before the lot processing period begins. Further, in the idle period of the times t6 to t7, a period in which the $N_2$ gas is supplied and a period (interval) in which the $N_2$ gas is not supplied are alternately repeated. As stated above, conventionally, the gas is constantly supplied in the idle period as in the processing of the substrate liquid processing apparatus according to the comparative example. However, by stopping the gas supply in the part of the idle period as in the processing of the substrate liquid processing apparatus A1 of the exemplary embodiment, it becomes difficult for the flow of the processing liquid 43 to be generated within the processing tub 41, so that generation of the crystals at the edges of the openings of the gas nozzles 70 or the like can be suppressed.

Further, as stated in the description of FIG. 14A and FIG. 14B, in the substrate liquid processing apparatus A1, the control unit 7 alternately repeats, in the idle period: the first control of stopping the gas supply and introducing the processing liquid 43 into the gas supply line 93; and the second control of controlling the gas supply unit 90 to perform the gas supply (refer to the idle period ranging from the time t6 to the time t7 in FIG. 14B). As the gas is supplied in the second control, the state of the processing liquid 43 can be maintained uniform. Further, as the first control of stopping the gas supply and introducing the processing liquid 43 and the second control of perform the gas supply are repeated alternately, the processing liquid 43 containing the crystals introduced in the first control can be flown to, for example, the processing tub 41 in the second control. As stated, by returning the introduced crystals back into the processing liquid within the processing tub 41, the crystals can be removed more securely.

Further, the substrate liquid processing apparatus A1 further includes the opening line 97 configured to open the gas flowing in the gas supply line 93 to the atmosphere, and the decompression unit 95 is equipped with the opening valve 96 configured to open or close the opening line 97. As the opening valve 96 is opened, the gas supply line 93 is decompressed. As the second control in the state that the processing liquid 43 is introduced in the gas supply line 93, the control unit 7 performs: the third control of controlling the gas supply unit 90 to supply the gas and controlling the decompression unit 95 to open the opening valve 96 to introduce the gas flowing in the gas supply line 93 into the opening line 97; and the fourth control of controlling the gas supply unit 90 to supply the gas and controlling the decompression unit 95 to close the opening valve 96 to allow the gas flowing in the gas supply line 93 to be flown toward the gas nozzles 70. As a result of introducing the processing liquid 43 or the like, water droplets may stay in the opening line 97 connected to the gas supply line 93. As the gas is flown into the opening line 97 in the third control, those water droplets or the like can be removed, and these water droplets can be suppressed from being introduced into the gas supply line 93 side (finally, the inside of the processing tub 41). Moreover, as the gas is flown to the gas nozzles 70 in the fourth control, the state of the processing liquid 43 can be maintained uniform by the gas supply when the gas is discharged from the gas nozzles 70, for example.

Furthermore, the processing of removing the water droplets or the like from the opening line 97 (which is the same processing as the above-stated third control) may be performed in the cleaning period (for example, in a cleaning period ranging from a time t5 to the time t6 in FIG. 14B) within the processing liquid changing period. That is, in the substrate liquid processing apparatus A1, the gas is flown into the opening line 97 in the cleaning period within the processing liquid changing period, as depicted in the processes S95 to S98 of FIG. 7 and in FIG. 12G, so that the water droplets or the like in the opening line 97 are removed. This processing is one which is not performed in a conventional substrate liquid processing apparatus (for example, the substrate liquid processing apparatus of the comparative example shown in FIG. 14A).

In addition, in the substrate liquid processing apparatus A1, as the fourth control, the control unit 7 performs the fifth control of controlling the gas supply unit 90 such that the processing liquid 43 introduced in the gas supply line 93 flows into the processing tub 41; and the sixth control of controlling the gas supply unit 90 such that the processing liquid 43 introduced in the gas supply line 93 is slightly moved within the gas supply line 93. In the fifth control, as the introduced processing liquid 43 is flown into the processing tub 41, it is possible to appropriately generate the upward flow of the processing liquid 43 while appropriately removing the crystals. Further, in the sixth control, as the gas is supplied such that the processing liquid 43 is slightly moved (that is, such that the processing liquid 43 is not completely drained from the gas supply line 93), discharging parts of the gas nozzles 70 can be maintained wet. Accordingly, the generation of the crystals in the vicinity of the discharging parts of the gas nozzles 70 (at the edges of the openings of the gas nozzles 70) can be suppressed.

Further, the idle period includes: the first idle period transited from the lot processing period (substrate processing period) during which the processing upon the substrates 8 is performed in the processing tub 41; and the second idle period transited from the processing liquid changing period during which the processing liquid 43 is changed in the processing tub 41. The control unit 7 controls the decompression unit 95 such that the introduction amount of the processing liquid 43 in the second idle control as the first control in the second idle period is larger than the introduction amount of the processing liquid 43 in the first idle control as the first control in the first idle period. In general, the processing liquid after the substrate processing is contaminated in most cases, it is not desirable to introduce this processing liquid 43 in a large amount in the idle processing performed after the lot processing. In consideration of this, by setting the introduction amount of the processing liquid 43 in the second idle control to be larger than the introduction amount of the processing liquid 43 in the first idle control, the contaminated processing liquid 43 after the substrate processing can be suppressed from being introduced into the gas supply line 93 in the large amount.

So far, the present exemplary embodiment has been described. However, the present exemplary embodiment is not intended to be anyway limiting. By way of example, though the substrate liquid processing apparatus A1 has been described to include the cleaning apparatus 1 using the processing liquid 43 such as the SC-1, the substrate liquid processing apparatus A1 may include a cleaning apparatus or an etching apparatus using any of various different kinds of processing liquids.

In the configuration of the decompression unit 95, the gas supply line 93 is decompressed by being opened to the atmosphere. However, the configuration of the decompression unit 95 is not limited thereto, and the decompression unit 95 may have any of various other configurations as long as it is capable of decompressing the gas supply line.

Further, in at least a part of the processing liquid changing period during which the change of the processing liquid is made in the processing tub 41, the control unit 7 may perform a high flow rate control of controlling the gas supply unit 90 such that a discharge amount of the gas from the gas nozzles 70 is larger than a discharge amount of the gas from the gas nozzles 70 in the lot period during which the processing upon the substrates 8 is performed in the processing tub 41. By way of non-limiting example, in the high flow rate control, the gas supply unit 90 is controlled such that the gas is discharged from the gas nozzles 70 in an amount five to six times as large as the typical discharge amount of the gas. Within the processing liquid changing period, the control unit 7 may perform the aforementioned high flow rate control in the cleaning period after the new processing liquid is supplied. To be more specific, the control unit 7 may perform the high flow rate control after a temperature raising control of raising the temperature of the new processing liquid is begun in the cleaning period. Furthermore, the control unit 7 may monitor a pressure value of the gas nozzle 70 while the high flow rate control is being performed. If the pressure value of the gas nozzle 70 exceeds a preset value, the control unit 7 may terminate the various processings in the processing tub 41, assuming that the gas nozzle 70 is clogged.

Figure 15A:
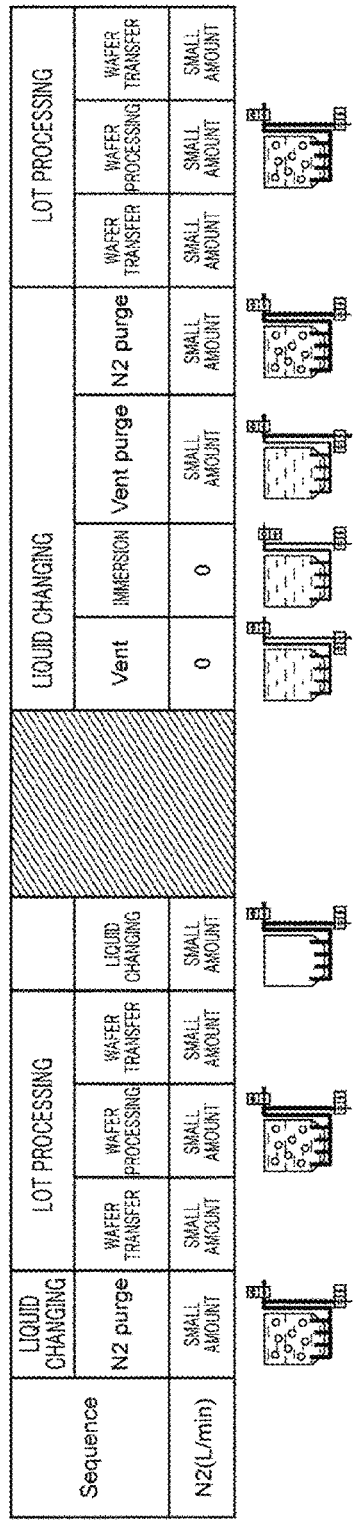
FIG. 15A and FIG. 15B are diagrams for describing a gas discharge from a gas nozzle in respective processings according to the comparative example and the exemplary embodiment, respectively.
Figure 15B:
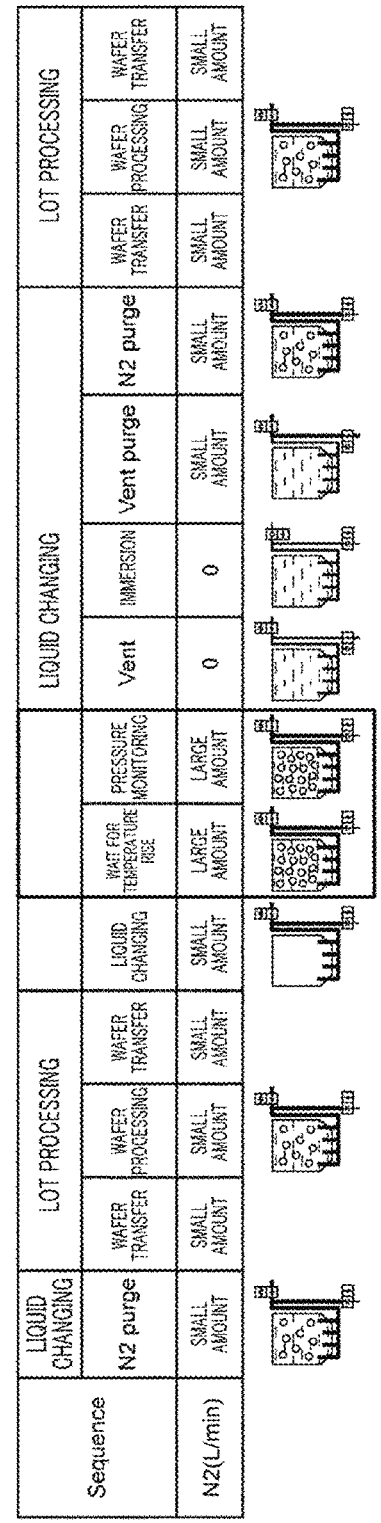

FIG. 15A and FIG. 15B are diagrams for describing gas discharges from the gas nozzle 70 in respective processings in accordance with the comparative example and the exemplary embodiment, respectively. As shown in FIG. 15A, in the lot processing during the lot period according to the comparative example, the gas supply unit 90 is controlled such that a small amount of the gas is discharged from the gas nozzle 70 in each of processings including a carry-in of the substrates 8 (wafer transfer), a processing upon the substrates 8 (wafer processing), a carry-out of the substrates 8 (wafer transfer). Further, in a processing liquid changing period between the lot periods, the gas supply unit 90 is controlled such that a small amount of the gas is discharged from the gas nozzle 70 in the liquid changing processing (liquid draining and processing liquid charging), and, then, in a cleaning period afterwards (marked as "Vent" and "Immersion" in FIG. 15A), the gas supply unit 90 is controlled such that the gas supply is stopped. In the processing liquid changing period according to the exemplary embodiment, however, as illustrated in FIG. 15B, as the cleaning period after the new processing liquid is supplied through the liquid changing processing, in a temperature raising control period (marked as "Wait for temperature rise" in FIG. 15B) of raising the temperature of the processing liquid and a pressure monitoring period afterwards (marked as "pressure monitoring" in FIG. 15B), the gas supply unit 90 is controlled such that the gas is discharged from the gas nozzles 70 in an amount larger than the small amount of the gas discharged in the lot processing. As stated above, in the exemplary embodiment shown in FIG. 15B, the control unit 7 performs, in the cleaning period within the processing liquid changing period, the high flow rate control of controlling the gas supply unit 90 such that a discharge amount of the gas from the gas nozzles 70 is larger than the discharge amount of the gas in the lot period (substrate processing period).

Figure 16:
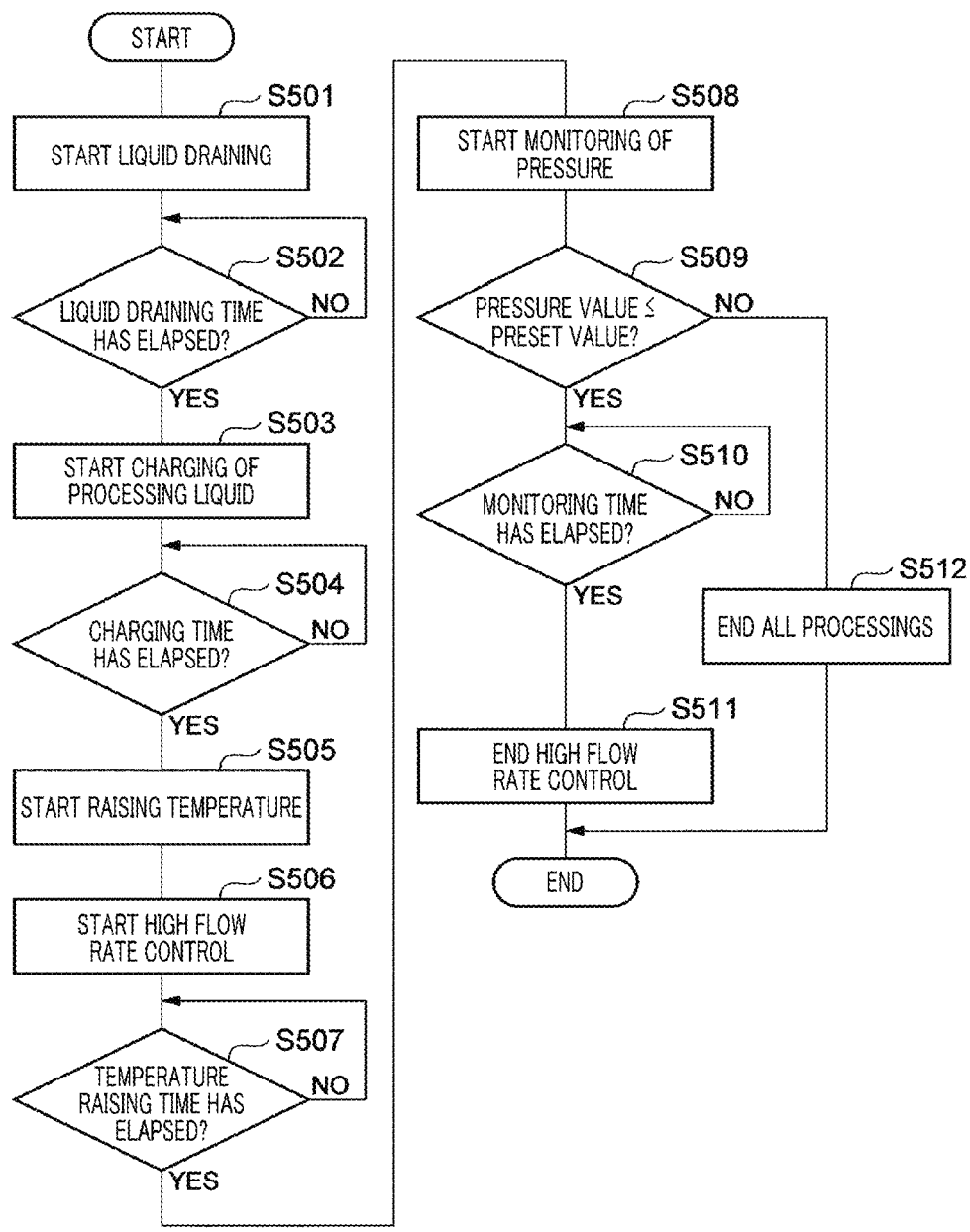
FIG. 16 is a flowchart illustrating a high flow rate control.

FIG. 16 is a flowchart illustrating the high flow rate control in the above-described processing liquid changing period. FIG. 16 only describes processings performed until the high flow rate control is ended within the aforementioned processing liquid changing period. As depicted in FIG. 16, in the processing liquid changing period, the control unit 7 first controls the processing liquid drain unit 67 to start draining of the processing liquid from the processing tub 41 (process S501). Then, the control unit 7 determines whether a predetermined draining time has elapsed (process S502). If it is found out that the predetermined draining time has passed by, the control unit 7 controls the processing liquid supply unit 44 to start charging of the processing liquid into the processing tub 41 (process S503). Thereafter, the control unit 7 determines whether a preset charging time has elapsed (process S504). If it is determined that the preset charging time has passed by, the control unit 7 controls a heating mechanism (not shown) such that the temperature rise of the processing liquid is begun (process S505).

Concurrently with (or immediately after) the beginning of the process S505, the control unit 7 starts the high flow rate control (process S506). To elaborate, the control unit 7 opens the supply valve 92 such that the gas supply into the gas supply line 93 is begun. At this time, the control unit 7 opens the supply valve 92 such that the discharge amount of the gas from the gas nozzles 70 is larger than the discharge amount of the gas in the lot period (substrate processing period).

Thereafter, the control unit 7 determines whether a predetermined temperature raising time has passed by (process S507). If it is found out that the predetermined temperature raising time has elapsed, the control unit 7 starts monitoring of a pressure of the gas nozzle 70 during the high flow rate control (process S508). The control unit 7 acquires a pressure value of the gas nozzle 70 measured by a pressure gauge (not shown) and determines whether the obtained pressure value is smaller than a preset value (process S509). If it is determined in the process S509 that the pressure value exceeds the preset value, the control unit 7 ends all the processings. Meanwhile, if it is determined that the pressure value is smaller than the preset value, the control unit 7 determines whether a preset pressure monitoring time has elapsed (process S510) and, if so, terminates the high flow rate control (process S511).

Figure 20:
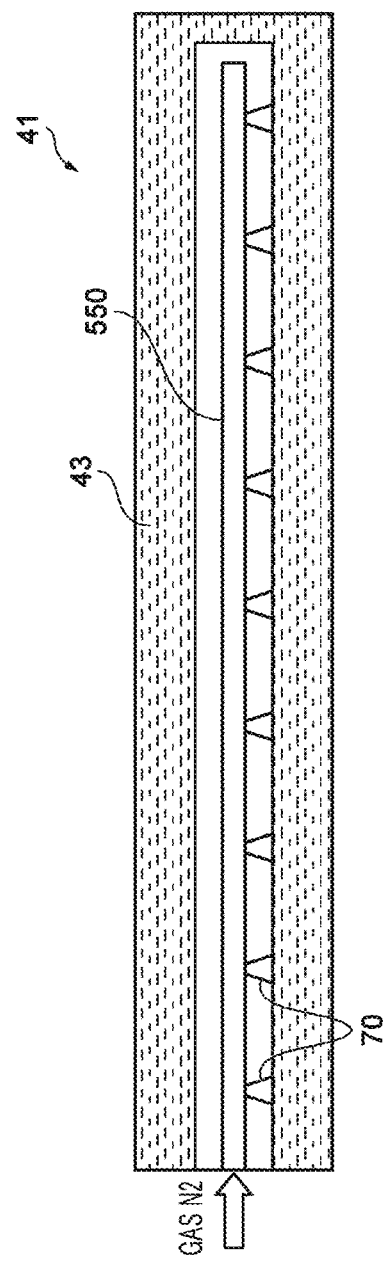
FIG. 20 is a diagram illustrating gas nozzles seen from a side thereof.
Figure 21:
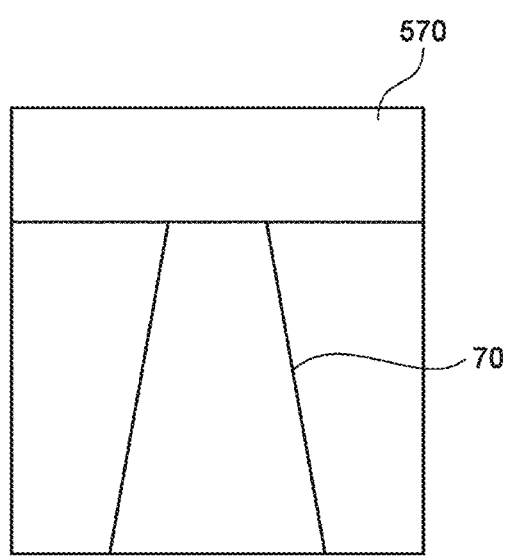
FIG. 21 is an enlarged view of the gas nozzle shown in FIG. 20.
Figure 22A:
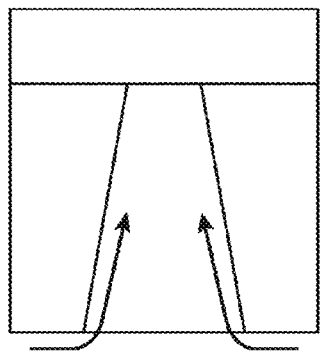
FIG. 22A to FIG. 22C are diagrams illustrating a crystallization mechanism in the gas nozzle.
Figure 22B:
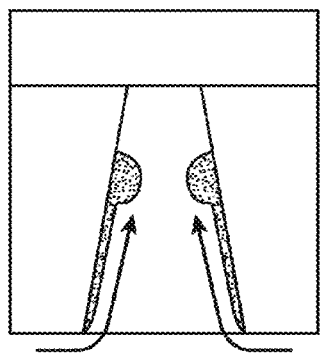
Figure 22C:
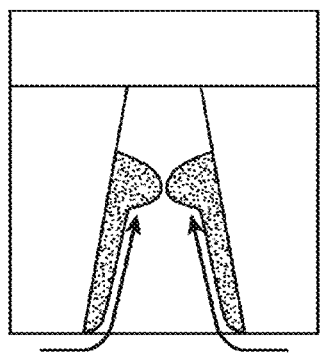

Now, an operation effect of performing the aforementioned high flow rate control will be explained. FIG. 20 is a (schematic) diagram illustrating the gas nozzles 70 seen from a side thereof. FIG. 21 is an enlarged view of the gas nozzle 70 shown in FIG. 20. FIG. 22A to FIG. 22C are diagrams illustrating a crystallization mechanism in the gas nozzle 70. FIG. 22A shows a state before the crystallization; FIG. 22B, a state in the middle of the crystallization; and FIG. 22C, a state in which the gas nozzle 70 is clogged after the crystallization.

As shown in FIG. 20, the multiple number of gas nozzles 70 are arranged in an extension direction of a supply pipe 550 extended in the inward direction of the processing tub 41 when viewed from a side of the processing tub 41. Each gas nozzle 70 is connected to the supply pipe 550. An inert gas (for example, the $N_2$ gas supplied by the gas supply unit 90) flowing in the supply pipe 550 is introduced into the gas nozzle 70, and the gas nozzle 70 discharges this inert gas. As illustrated in FIG. 21, the gas nozzle 70 has a substantially cone shape and is formed such that a pipe diameter is gradually increased as it goes downwards from a gas inlet position (that is, as it goes down towards a discharge opening of the gas nozzle 70).

As depicted in FIG. 22A, the processing liquid is introduced (flows back) into the gas nozzle 70 from the discharge opening side thereof. Accordingly, as shown in FIG. 22B, silica in the processing liquid is condensed to be dried at a gas-liquid interface within the gas nozzle 70, so that the crystallization takes place. Then, as shown in FIG. 22C, an inside of the gas nozzle 70 may be clogged as this crystallization further proceeds.

To resolve this problem, the control unit 7 performs the high flow rate control of controlling the gas supply unit 90 such that the discharge amount of the gas from the gas nozzle 70 in at least a part of the processing liquid changing period is larger than the discharge amount of the gas in the lot period. As the discharge amount of the gas from the gas nozzle 70 is increased, the crystal at the gas-liquid interface within the gas nozzle 70 can be removed.

As described above, the control unit 7 performs the above-stated high flow rate control in the cleaning period after the supply of the new processing liquid within the processing liquid changing period. To be more specific, the control unit 7 performs the high flow rate control after the temperature raising control of raising the temperature of the new processing liquid in the cleaning period is begun. In this way, by performing the high flow rate control in the cleaning period, an additional processing period for performing the high flow rate control need not be provided, so that the crystal can be removed without causing degradation of the processing efficiency or the like.

The control unit 7 monitors the pressure value of the gas nozzle 70 during the high flow rate control. If the pressure value exceeds the preset value, the control unit 7 assumes that the gas nozzle 70 is clogged, and then, terminates the various processings in the processing tub 41. By monitoring the pressure value during the high flow rate control, a pressure variation (that is, tendency of clogging) of the gas nozzle 70 can be investigated more appropriately. Further, when the pressure value exceeds the preset value, by ending the processings assuming that the gas nozzle 70 is clogged, it is possible to end the processings such as the lot processing at an optimal timing.

Figure 17:
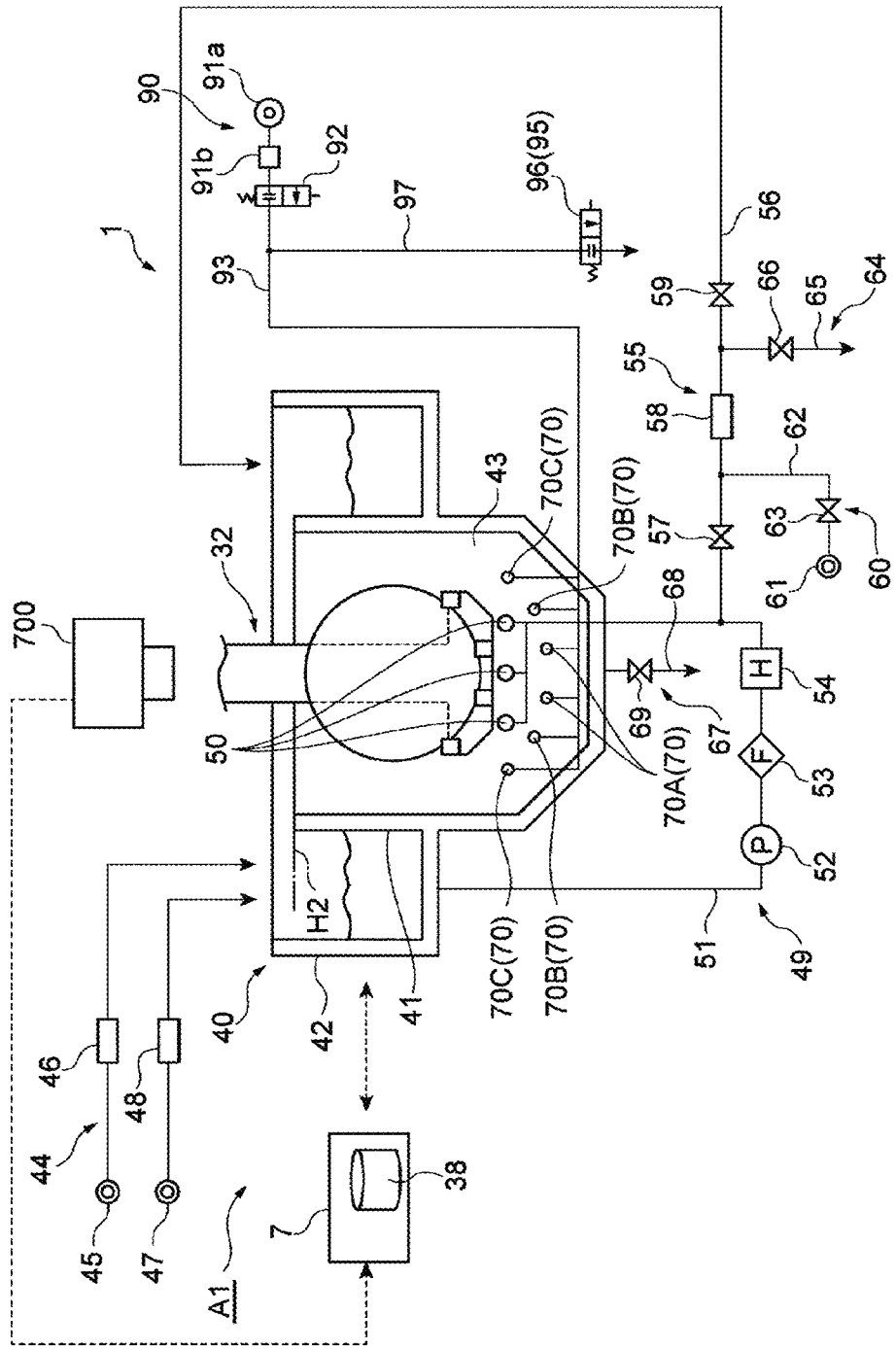
FIG. 17 is a schematic diagram of an etching apparatus according to a modification example.

The substrate liquid processing apparatus A1 may be further equipped with an imaging unit 700 provided at a position where it is capable of imaging the processing liquid within the processing tub 41, as shown in FIG. 17. The imaging unit 700 is not particularly limited as long as it is capable of imaging a boiling state within the processing tub 41 (phosphoric acid tub). By way of non-limiting example, the imaging unit 700 may be implemented by a high-speed camera. For example, the imaging unit 700 may be provided above the processing tub 41. The imaging unit 700 is configured to image the processing liquid within the processing tub 41 continually at a regular interval and output obtained images to the control unit 7.

Figure 18:
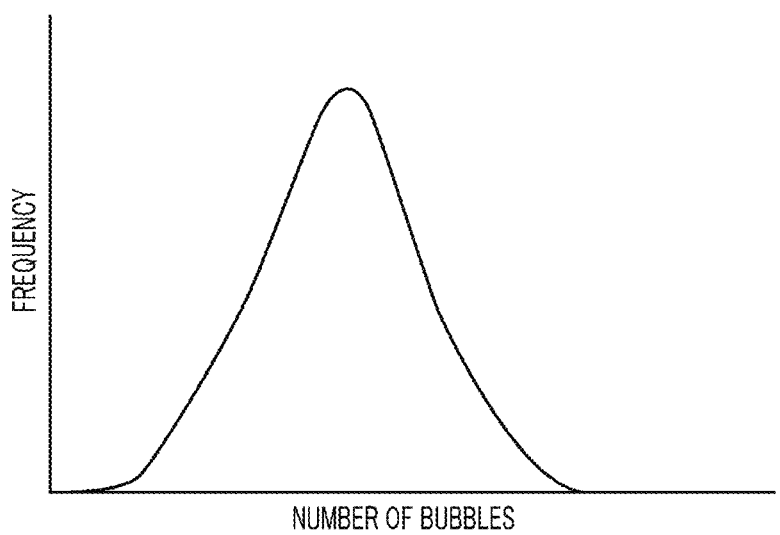
FIG. 18 is a graph showing a frequency distribution of a number of bubbles.

The control unit 7 specifies the boiling state of the processing liquid based on the images obtained by the imaging unit 700. By way of example, based on the images obtained by the imaging unit 700, the control unit 7 specifies (estimates) the number of bubbles in the processing liquid and then specifies the boiling state of the processing liquid based on this number of the bubbles. The control unit 7 may specify (estimate) the number of bubbles on each of a multiple number of images obtained by the imaging unit 700 within a preset period, and may specify the boiling state based on this number of the bubbles on each of the multiple number of images. Here, the multiple number of images means, by way of non-limiting example, several tens to several hundreds of sheets of images. FIG. 18 is a graph showing a frequency distribution of the number of bubbles. The control unit 7 specifies the number of the bubbles on each of the multiple number of images, calculates the number (frequency) of images having the same number of bubbles, and produces the frequency distribution as shown in FIG. 18. By way of example, the control unit 7 may regard the number of the bubbles having the highest frequency as the number of bubbles of the current processing liquid and may specify the boiling state of the processing liquid based on this number of the bubbles.

FIG. 19 is a diagram showing a relationship between the number of bubbles and the boiling state. As shown in FIG. 19, a range of the estimated number of bubble (for example, the number of bubbles having the highest frequency) and the boiling state are previously related, and the boiling state is defined as "non-boiling," "weak boiling," "appropriate boiling," "strong boiling," and "overboiling" in the order in which the number of the bubbles is increased. Here, "non-boiling" refers to a state where the bubbles are not generated and a liquid surface is calm without a ripple thereon, for example. "Weak boiling" is a state where the liquid surface hardly ripples although the generation of bubbles can be observed with eyes. "Appropriate boiling" refers to a state where small bubbles are generated in a large quantity and ripples of the liquid surface are observed with eyes. "Strong boiling" refers to a state where big bubbles are generated in a large quality and the liquid surface ripples greatly. "Overboiling" refers to a state where big bubble are generated in a large quantity, the liquid surface ripples fiercely, and the processing liquid is boiling over. The control unit 7 adjusts a concentration of the processing liquid based on the boiling state. Since the boiling state becomes stronger as the concentration of the processing liquid is lower, the control unit 7 increases the concentration of the processing liquid if the boiling state is strong, for example. The control unit 7 repeats the specification of the boiling state (and the adjustment of the concentration of the processing liquid based on the boiling state) at a preset cycle.

Details of an example method for a control over the boiling state through the above-described interpretation of the images will be described hereinafter. The obtained images are put into a PC as database. The boiling state is determined based on these images by using image processing software. When there is a discrepancy from a reference boiling state (that is, there is a variation from the reference boiling state), a variation amount feedback control (a processing of returning a changed concentration to a preset range) is performed to maintain the boiling state of the processing liquid constant. In the processing using the image processing software, a differential image between the obtained image of the bubbles and the background image (single phase image) is produced. Accordingly, a new image (differential image) can be produced by taking an absolute value of a difference between pixel brightness values (brightness per unit area) at same positions on the images. In the differential image, a portion other than the bubbles is removed. Then, by treating the differential image with a median filter, minute noises are removed (that is, noises other than brightness regarded as the bubble are removed). Thereafter, by performing binarization processing, only the bubbles are extracted from the image and the number of the bubbles is measured. A bubble having a diameter equal to or less than a preset value (e.g., 0.4 mm or less) may be excluded from the measurement to avoid deterioration of measurement accuracy. These processings are performed on each of the multiple number of images, and the number of images (frequency) having the same number of bubbles is calculated as a measurement result. Subsequently, by combining the measurement result and the number of the bubbles in each boiling state stored in the database (see FIG. 19), the current boiling state is determined. Further, as the measurement result, the number of bubbles having the highest frequency may be used as stated above, or the maximum number of bubbles may be used. Further, when there is a variation from the reference boiling state, the boiling state is adjusted by feedbacking the variation amount to the concentration of the processing liquid.

As discussed above, as the substrate liquid processing apparatus A1 is further equipped with the imaging unit 700 provided at the position where it is capable of imaging the processing liquid within the processing tub 41, the state (for example, the boiling state) of the processing liquid within the processing tub 41 can be easily investigated, so that the adjustment of the processing liquid (for example, the adjustment of the concentration of the processing liquid) can be easily and securely performed based on the state of the processing liquid.

Furthermore, the control unit 7 specifies the boiling state of the processing liquid based on the images obtained by the imaging unit 700. As a way to specify the boiling state, a method using a sensor such as a head pressure sensor may be considered. Since, however, the sensor has an individual variation or adjustment thereof may become non-uniform, it may be difficult to investigate the boiling state accurately. To solve this problem, by specifying the boiling state of the processing liquid from the images obtained by the imaging unit 700, it is possible to specify the boiling state of the processing liquid with high accuracy, the same as in a case where a person observes it with eyes. Further, the control unit 7 estimates the number of bubbles in the processing liquid based on the images and specifies the boiling state based on the number of the bubbles. Since the number of the bubbles and the boiling state are closely related, it is possible to specify the boiling state more accurately through the above-described method. Moreover, the control unit 7 estimates the number of the bubbles on each of the multiple number of images, and specifies the boiling state based on the number of the bubbles on each of the multiple number of images. Thus, as compared to a case where the boiling state is specified from only a single sheet of image, for example, it is possible to specify the boiling state with higher accuracy.

Furthermore, the control unit 7 adjusts the concentration of the processing liquid based on the boiling state. Thus, the concentration of the processing liquid can be adjusted to be within a required range in an easy way. Further, the control unit 7 is capable of performing such a processing as the adjustment of the concentration based on the boiling state continually by repeating the specification of the boiling state at a preset cycle. In addition, as the imaging unit 700 is provided above the processing tub 41, the bubbles of the processing liquid are easy to specify, so that the specification of the boiling state can be performed with higher accuracy.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate liquid processing apparatus, comprising:
    a processing tub configured to accommodate a processing liquid and a substrate therein;
    a processing liquid nozzle configured to discharge the processing liquid into the processing tub;
    multiple gas nozzles configured to discharge a gas into a lower portion within the processing tub and arranged under the processing liquid nozzle along an arc concentric with the substrate within the processing tub such that a height of each of the multiple gas nozzles increases as a distance from a center of the processing tub increases in a width direction;
    a gas supply unit configured to supply the gas into the processing tub through the gas nozzles;
    a gas supply line through which the gas nozzles and the gas supply unit are connected;
    a decompression unit configured to decompress the gas supply line and introduce the processing liquid within the processing tub into the gas supply line; and
    a control unit configured to control the gas supply unit and the decompression unit, wherein the control unit is further configured to perform a first control of controlling the gas supply unit to stop a supply of the gas, and controlling the decompression unit to introduce an amount of the processing liquid into the gas supply line in a first control part of an idle period during which the substrate is not accommodated in the processing tub; and
    after a predetermined amount of time, controlling the gas supply unit and decompression unit to remove the processing liquid from the gas supply line to the processing tub in a second control part of the idle period,
    wherein in the idle period, the control unit repeats alternately the first control part and second control part;
    wherein the idle period includes: a first idle period transited from a substrate processing period during which a processing upon the substrate is performed in the processing tub; and a second idle period transited from a processing liquid changing period during which the processing liquid is changed in the processing tub, and
    the control unit is further configured to control the decompression unit such that an introduction amount of the processing liquid in the first control in the second idle period is larger than an introduction amount of the processing liquid in the first control in the first idle period.

2. The substrate liquid processing apparatus of claim 1, further comprising:
    an opening line configured to open the gas flowing in the gas supply line to the atmosphere,
    wherein the decompression unit is equipped with a valve configured to open or close the opening line, and the decompression unit decompresses the gas supply line as the valve is opened, and
    in a state that the processing liquid is introduced into the gas supply line, the second control comprises a third control of controlling the gas supply unit to perform the supply of the gas and the decompression unit to open the valve to allow the gas flowing in the gas supply line to be introduced into the opening line; and a fourth control of controlling the gas supply unit to perform the supply of the gas and controlling the decompression unit to close the valve to allow the gas flowing in the gas supply line to be flown toward the gas nozzles.

3. The substrate liquid processing apparatus of claim 2, wherein the fourth control comprises a fifth control of controlling the gas supply unit such that the processing liquid introduced into the gas supply line flows into the processing tub; and a sixth control of controlling the gas supply unit such that the processing liquid introduced into the gas supply line is moved from a current position to other positions within the gas supply line.

4. The substrate liquid processing apparatus of claim 1, wherein the control unit performs a flow rate control of controlling the gas supply unit such that a discharge amount of the gas from the gas nozzles in at least a part of a processing liquid changing period during which the processing liquid is changed in the processing tub is larger than a discharge amount of the gas from the gas nozzles in a substrate processing period during which a processing upon the substrate is performed in the processing tub.

5. The substrate liquid processing apparatus of claim 4, wherein, during the processing liquid changing period, the control unit performs the flow rate control in a cleaning period after a new processing liquid is supplied.

6. The substrate liquid processing apparatus of claim 5, wherein the control unit performs the flow rate control after a temperature raising control of raising a temperature of the new processing liquid in the cleaning period is begun.

7. The substrate liquid processing apparatus of claim 4, wherein the control unit monitors a pressure value of at least one of the gas nozzles while the flow rate control is being performed.

8. The substrate liquid processing apparatus of claim 7, wherein, when the pressure value of the at least one monitored gas nozzle exceeds a predetermined value, the control unit assumes that the at least one monitored gas nozzle is clogged, and then, ends various kinds of processings in the processing tub.

9. The substrate liquid processing apparatus of claim 1, further comprising:
an imaging unit provided at a position where the processing liquid within the processing tub is allowed to be imaged.

10. The substrate liquid processing apparatus of claim 9, wherein the control unit specifies a boiling state of the processing liquid based on an image of the processing liquid obtained by the imaging unit.

11. The substrate liquid processing apparatus of claim 10, wherein the control unit estimates a number of bubbles in the processing liquid based on the image, and specifies the boiling state based on the number of the bubbles.

12. The substrate liquid processing apparatus of claim 11, wherein the image includes multiple images,
the control unit estimates the number of the bubbles on each of the multiple images obtained by the imaging unit in a preset period, and specifies the boiling state based on the number of the bubbles on each of the multiple images.

13. The substrate liquid processing apparatus of claim 10, wherein the control unit adjusts a concentration of the processing liquid based on the boiling state.

14. The substrate liquid processing apparatus of claim 10, wherein the control unit repeats the specification of the boiling state at a preset cycle.

15. The substrate liquid processing apparatus of claim 9, wherein the imaging unit is provided above the processing tub.

16. A substrate liquid processing method to keep gas lines open in a liquid processing apparatus, comprising:
(a) controlling a gas supply unit to supply a gas into a processing tub through a gas nozzle;
(b) stopping a supply of the gas from the gas nozzle in a state in which the gas is being discharged to the processing tub, the gas nozzle being configured to discharge the gas into a lower portion of the processing tub in a part of an idle period during which a substrate is not accommodated in the processing tub;
(c) decompressing the gas supply line and introducing a processing liquid within the processing tub into a gas supply line, through which the gas nozzle and the gas supply unit are connected, in the part of the idle period such that crystals at an edge of an opening of the gas nozzle are introduced into the gas supply line; and
(d) removing the processing liquid from the gas supply line into the processing tub by controlling the gas supply unit;
(e) repeating the above steps of introducing the processing liquid in the gas supply line and removing the processing liquid from the gas supply line into the processing tub one or more times;
if) continuing with substrate processing,
wherein the idle period includes: a first idle period transited from a substrate processing period during which a processing upon the substrate is performed in the processing tub; and a second idle period transited from a processing liquid changing period during which the processing liquid is changed in the processing tub, and
in (c), controlling an introduction amount of the processing liquid in the second idle period to be larger than an introduction amount of the processing liquid in the first idle period.

17. A non-transitory computer-readable recording medium having stored thereon computer-executable instructions that, in response to execution, cause an apparatus to perform a substrate liquid processing method as claimed in claim 16.

* * * * *

UNITED STATES PATENT AND TRADEMARK OFFICE
CERTIFICATE OF CORRECTION

PATENT NO. : 11,594,430 B2
APPLICATION NO. : 16/124529
DATED : February 28, 2023
INVENTOR(S) : Takafumi Tsuchiya et al.

It is certified that error appears in the above-identified patent and that said Letters Patent is hereby corrected as shown below:

In the Claims

Column 32, Line 26, Claim 16, "if)" should be -- (f) --.

Signed and Sealed this
Eleventh Day of June, 2024

Katherine Kelly Vidal
*Director of the United States Patent and Trademark Office*